(12) United States Patent
Han et al.

(10) Patent No.: US 11,889,673 B2
(45) Date of Patent: Jan. 30, 2024

(54) DUAL PORT SRAM CELL AND DESIGN METHOD THEREOF

(71) Applicant: SAMSUNG ELECTRONICS CO., LTD., Suwon-si (KR)

(72) Inventors: Sangshin Han, Suwon-si (KR); Taehyung Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 112 days.

(21) Appl. No.: 17/698,336

(22) Filed: Mar. 18, 2022

(65) Prior Publication Data

US 2023/0005936 A1    Jan. 5, 2023

(30) Foreign Application Priority Data

Jun. 30, 2021  (KR) ......................... 10-2021-0085765

(51) Int. Cl.
*G11C 11/00* (2006.01)
*H10B 10/00* (2023.01)
*G11C 11/412* (2006.01)
*G11C 11/419* (2006.01)

(52) U.S. Cl.
CPC ............ *H10B 10/12* (2023.02); *G11C 11/412* (2013.01); *G11C 11/419* (2013.01)

(58) Field of Classification Search
CPC ..... H10B 10/12; G11C 11/412; G11C 11/419; G11C 5/063; G11C 7/02; G11C 7/18; G11C 8/14; G11C 8/16; G11C 5/025; G11C 11/4085; G11C 11/4097

USPC .......................................................... 365/154
See application file for complete search history.

(56) References Cited

U.S. PATENT DOCUMENTS

| | | | |
|---|---|---|---|
| 9,305,633 B2 * | 4/2016 | Grover | G11C 11/412 |
| 9,646,973 B2 | 5/2017 | Liaw | |
| 9,847,120 B2 | 12/2017 | Liaw | |
| 10,177,132 B2 * | 1/2019 | Wang | G11C 11/412 |
| 10,381,056 B2 | 8/2019 | Lu et al. | |
| 11,088,151 B2 | 8/2021 | Fujiwara et al. | |
| 2006/0092680 A1 | 5/2006 | Nii | |
| 2019/0228818 A1 | 7/2019 | Liaw | |
| 2021/0265335 A1 * | 8/2021 | Liaw | G11C 8/16 |

FOREIGN PATENT DOCUMENTS

| | | |
|---|---|---|
| KR | 10-2007-0071075 A | 7/2007 |
| KR | 10-2021-0039894 A | 4/2021 |

\* cited by examiner

*Primary Examiner* — Tha-O H Bui
(74) *Attorney, Agent, or Firm* — Sughrue Mion, PLLC

(57) ABSTRACT

An integrated circuit includes: a dual port Static Random Access Memory (SRAM) cell including a plurality of transistors; a bit line pair connected to the dual port SRAM cell, the bit line pair including a first bit line and a second bit line spaced apart from each other in a first direction and extending in a second direction perpendicular to the first direction; a power line group including a plurality of power lines spaced apart from each other in the first direction, spaced apart from the bit line pair placed in the first direction, and extending in the second direction, the power line group being configured to apply a voltage to the dual-port SRAM cell; and a first word line provided between the first bit line and the second bit line and connected to the dual port SRAM cell.

20 Claims, 16 Drawing Sheets

DUAL PORT SRAM CELL AND DESIGN METHOD THEREOF

CROSS-REFERENCE TO RELATED APPLICATION

This application is based on and claims priority under 35 U.S.C. § 119 to Korean Patent Application No. 10-2021-0085765, filed on Jun. 30, 2021, in the Korean Intellectual Property Office, the disclosure of which is incorporated by reference herein in its entirety.

BACKGROUND

The present disclosure relates to a dual port Static Random Access Memory (SRAM) cell and a method of designing a dual port SRAM cell, and more particularly, to a layout of a dual port SRAM cell.

The technology related to a semiconductor device continues to achieve remarkable growth worldwide due to the active demands of semiconductor users and the ceaseless efforts of semiconductor producers. In addition, semiconductor producers strive to make semiconductor devices more miniaturized, highly integrated, and have large capacity, while spurring research and development to achieve higher speed and performing more stable and smooth operation. The efforts of these semiconductor manufacturers bring advances in micro-processing technology, micro device technology, and circuit design technology, so that there are remarkable achievements in the technology of semiconductor memory cells such as Dynamic Random Access Memory (DRAM) or SRAM.

In particular, in the SRAM field, a dual port SRAM capable of performing high-speed read and write operations compared to the existing single port SRAM has been developed. In a related art single-port SRAM, one unit memory cell includes six transistors. For instance, the related art single-port SRAM includes two load transistors, two driving transistors, and two active transistors to sequentially perform read and write operations. However, the dual port SRAM is configured to perform read and write operations in dual mode by adding two active transistors to a related art single-port SRAM, and is used in integrated circuits requiring high speed.

SUMMARY

One or more example embodiments provide an integrated circuit capable of removing interference occurring between bit lines by disposing word lines between the bit lines.

Further, one or more example embodiments provide an integrated circuit capable of shielding a bit line by arranging a dummy line between a bit line and a power line.

Further still, one or more example embodiments provide an integrated circuit capable of improving a crosstalk phenomenon occurring between bit lines included in different bit cells by including a boundary dummy line between different bit cells neighboring in the first direction.

The technical problems addressed by the present disclosure are not limited to the technical problems mentioned above, and other technical problems not mentioned will be clearly understood by those skilled in the art from the following description.

According to an aspect of an example embodiment, there is provided an integrated circuit including: a dual port Static Random Access Memory (SRAM) cell including a plurality of transistors; a bit line pair connected to the dual port SRAM cell, the bit line pair including a first bit line and a second bit line spaced apart from each other in a first direction and extending in a second direction perpendicular to the first direction; a power line group including a plurality of power lines spaced apart from each other in the first direction, spaced apart from the bit line pair placed in the first direction, and extending in the second direction, the power line group being configured to apply a voltage to the dual-port SRAM cell; and a first word line provided between the first bit line and the second bit line and connected to the dual port SRAM cell.

According to an aspect of an example embodiment, there is provided an integrated circuit including: a first bit cell and a second bit cell adjacent to the first bit cell in a first direction; a boundary dummy line extending in a second direction perpendicular to the first direction at a boundary between the first bit cell and the second bit cell and electrically independent from the first bit cell and the second bit cell; a first bit line pair connected to the first bit cell, the first bit line pair including a first bit line and a second bit line extending in the second direction and spaced apart from each other in the first direction; a first complementary bit line pair spaced apart from the first bit line pair in the first direction and connected to the first bit cell, the first complementary bit line pair including a first complementary bit line complementary to the first bit line and a second complementary bit line complementary to the second bit line; a power line group including a plurality of power lines provided between the first bit line pair and the first complementary bit line pair and spaced apart from the first bit line pair in the first direction, the power line group being configured to apply a voltage to the first bit cell; a first word line provided between the first bit line and the second bit line and connected to the first bit cell; and a second word line provided between the first complementary bit line and the second complementary bit line and connected to the first bit cell.

According to an aspect of an example embodiment, there is provided an integrated circuit design method including: forming a first bit cell; forming, on the first bit cell, a first bit line pair including a first bit line and a second bit line spaced apart from each other in a first direction and extending in a second direction perpendicular to the first direction; forming, on the first bit cell, a first complementary bit line pair including a first complementary bit line and a second complementary bit line spaced apart from each other in the first direction and extending in the second direction; and forming, on the first bit cell, a first word line between the first bit line and the second bit line and a second word line between the first complementary bit line and the second complementary bit line.

BRIEF DESCRIPTION OF THE DRAWINGS

The above and/or other aspects will be more clearly understood from the following detailed description taken in conjunction with the accompanying drawings in which.

DETAILED DESCRIPTION

Figure 1:
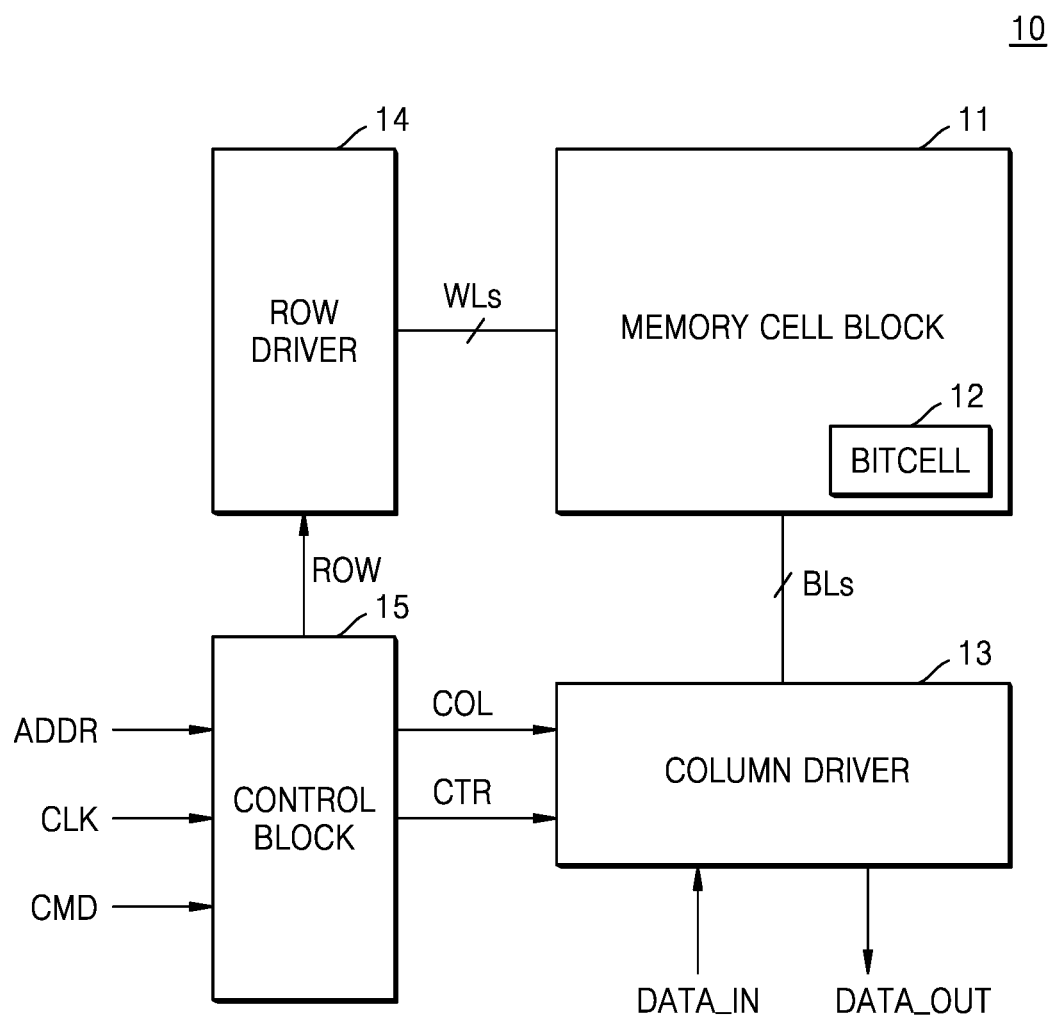
FIG. 1 is a block diagram of an integrated circuit (IC) according to example embodiments.

Hereinafter, various embodiments of the disclosure will be described with reference to the accompanying drawings. Hereinafter, the horizontal direction in the layout diagram is defined as the first direction X, the vertical direction in the layout diagram is defined as the second direction Y, and the direction substantially perpendicular to the layout diagram is defined as the third direction Z. Accordingly, the second direction Y may mean a direction perpendicular to the first direction X. The direction indicated by the arrow in the drawing and the opposite direction thereof will be described as the same direction. Definitions of the directions described above are the same in all drawings hereinafter. In the drawings of this specification, only a portion may be shown for convenience of illustration. When describing with reference to the drawings, the same or corresponding components are given the same reference numerals, and overlapping descriptions thereof will be omitted.

FIG. 1 is a block diagram of an integrated circuit according to an example embodiment.

Referring to FIG. 1, an integrated circuit 10 may receive a command CMD, an address ADDR, a clock signal CLK, and write data DATA_IN, and output a read data DATA_OUT. For example, the integrated circuit 10 may receive a command CMD (which may be referred to as a write command) instructing a write, an address ADDR (which may be referred to as a write address), and write data DATA_IN and may store the write data DATA_IN in an area of a memory cell block 11 corresponding to the address. In addition, the integrated circuit 10 may receive a command CMD (which may be referred to as a read command) and an address ADDR (which may be referred to as a read address) instructing a read, and may output to the outside the read data DATA_OUT stored in the area of the memory cell block 11 corresponding to the address.

The memory cell block 11 may include a plurality of bit cells 12. The plurality of bit cells 12 may be arranged at regular intervals. The plurality of bit cells 12 may be provided at intersections of the word lines WLs and the bit lines BLs. That is, each of the plurality of bit cells 12 may be connected to at least one of the plurality of word lines WLs and may be connected to at least one of the plurality of bit lines BLs.

Each of the plurality of bit cells 12 may be a memory cell. For example, each of the plurality of bit cells 12 may be static random access memory (SRAM), or a volatile memory cell such as, for example, dynamic random access memory (DRAM). In particular, each of the plurality of bit cells 12 may be a dual port SRAM (DPSRAM) cell capable of simultaneously performing a write operation and a read operation. According to an example embodiment, the bit cell 12 may be a non-volatile memory cell, such as flash memory, resistive random access memory (RRAM), or the like. Example embodiments of the present disclosure will be mainly described with reference to a DPSRAM cell, but embodiments of the present disclosure are not limited thereto.

According to an example embodiment, the integrated circuit 10 may include a column driver 13, a row driver 14 and a control block 15. The column driver 13 may be connected to the memory cell block 11 through a plurality of bit lines BLs. The column driver 13 may select at least one bit line from among the plurality of bit lines BLs based on the column address COL. For example, the column driver 13 may select a first bit line BLA of FIG. 2 and a first complementary bit line BLAb of FIG. 2, which is complementary to the first bit line BLA of FIG. 2. The first bit line BLA and the first complementary bit line BLAb may be connected to any one of the plurality of bit cells 12. Accordingly, as the column driver 13 selects the first bit line BLA and the first complementary bit line BLAb, a plurality of bit cells 12 connected to the first bit line BLA and the first complementary bit line BLAb may be selected.

The column driver 13 may perform a read operation or a write operation based on the control signal CTR. The column driver 13 may identify values stored in a bit cell connected to an activated word line among a plurality of bit cells 12 by sensing a current and/or a voltage received through the plurality of bit lines BLs, and may output the read data DATA_OUT based on the identified values. The column driver 13 may apply a current and/or a voltage to the plurality of bit lines BLs based on the write data DATA_IN, and may write values to one of the plurality of bit cells 12 connected to the activated word line. According to an example embodiment, the column driver 13 may include a read circuit that performs a read operation and a write circuit that performs a write operation. According to an example embodiment, the column driver 13 may include a bit line precharge circuit for precharging the plurality of bit lines BLs.

The row driver 14 may be connected to the memory cell block 11 through a plurality of word lines WLs. The row driver 14 may activate at least one word line among the plurality of word lines WLs based on the row address ROW. That is, the row driver 14 may select at least one word line from among the plurality of word lines WLs. Accordingly, bit cells connected to the activated word line may be selected from among the plurality of bit cells 12.

The control block 15 may receive a command CMD, an address ADDR, and a clock signal CLK, and may generate a row address ROW, a column address COL, and a control signal CTR. For example, the controller 15 may identify the read command by decoding the command CMD, and may generate a row address ROW, a column address COL, and a control signal CTR to read the read data DATA_OUT from the memory cell block 11. Also, the control block 15 may identify the write command by decoding the command CMD, and may generate a row address ROW, a column address COL, and a control signal CTR to write data DATA_IN to the memory cell block 11.

Example embodiments of the present disclosure are described primarily with reference to a DPSRAM cell, so that each of the plurality of bit cells 12 may be connected to two word lines, two bit lines, and two complementary bit lines. Hereinafter, the layout of each of the plurality of bit cells 12 will be described in detail.

Figure 2:
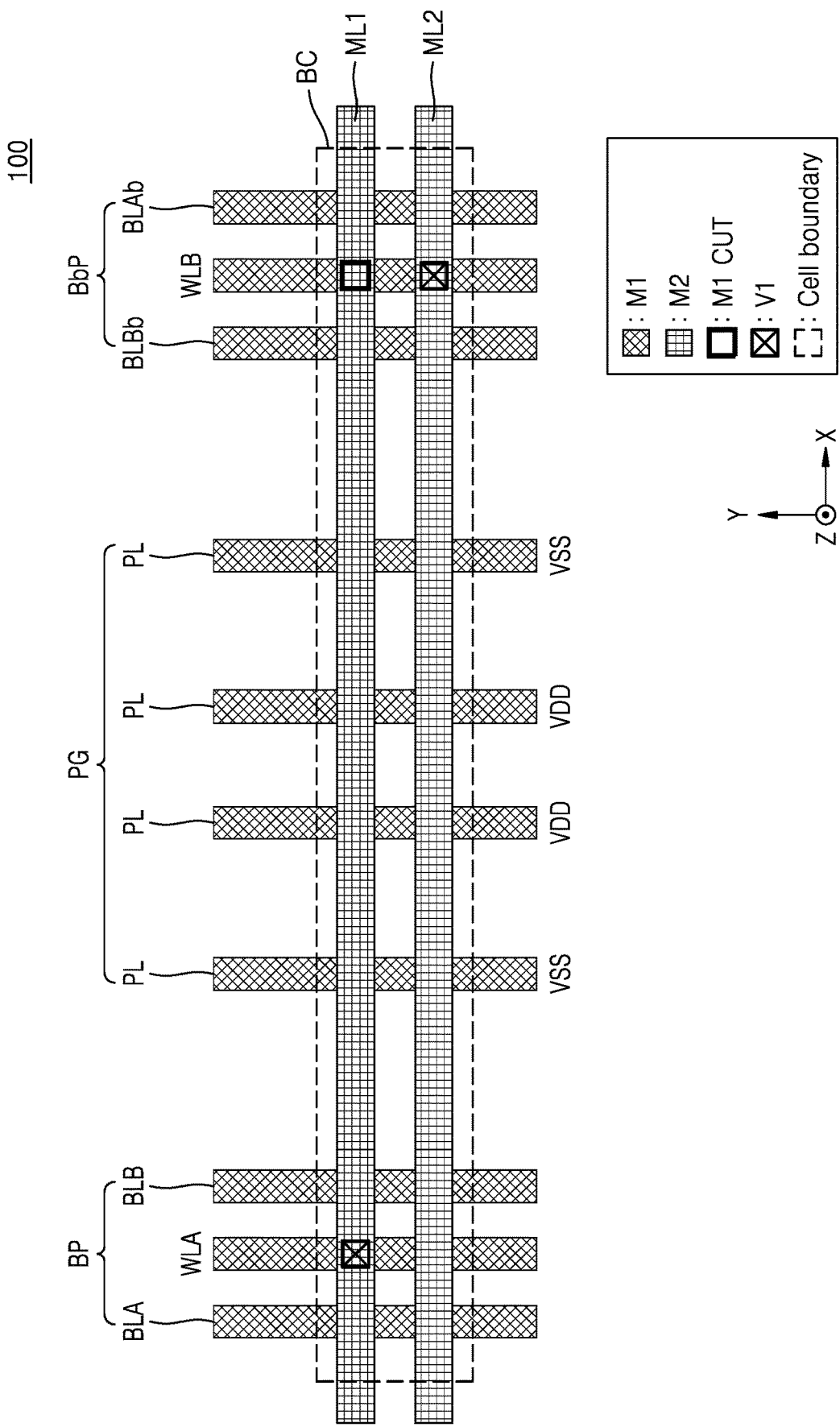
FIG. 2 is a layout diagram of a bit cell according to an example embodiment.

FIG. 2 is a layout diagram of a bit cell according to an example embodiment. Specifically, FIG. 2 is a plan view showing the layout of bit lines and word lines connected to any one bit cell of the plurality of bit cells 12 of FIG. 1 on a plane formed in a first direction X and a second direction Y. In FIG. 2, only some layers may be shown for convenience of illustration, and in order to show the connection between the pattern of the upper wiring layer and the pattern of the lower wiring layer, a via may be displayed despite being under the pattern of the upper wiring layer. For convenience of description, other components constituting the bit cell may be omitted.

Referring to FIG. 2, an integrated circuit 100 may include a bit cell BC. The bit cell BC may be connected to the first bit line BLA and the second bit line BLB. The first bit line BLA and the second bit line BLB may be spaced apart from each other in the first direction X. The first bit line BLA and the second bit line BLB may extend in the second direction Y. The first bit line BLA and the second bit line BLB may constitute a bit line pair BP.

The bit cell BC may be connected to the first complementary bit line BLAb and the second complementary bit line BLBb. The first complementary bit line BLAb may be complementary to the first bit line BLA, and the second complementary bit line BLBb may be complementary to the second bit line BLB. The first complementary bit line BLAb and the second complementary bit line BLBb may be spaced apart from each other in the first direction X. The first complementary bit line BLA and the second complementary bit line BLBb may extend in the second direction Y. The first complementary bit line BLAb and the second complementary bit line BLBb may constitute a complementary bit line pair BbP. The complementary bit line pair BbP and the bit line pair BP may be spaced apart from each other in the first direction X with a predetermined interval therebetween.

The bit cell BC may be connected to the power line group PG. The power line group PG may be provided between the bit line pair BP and the complementary bit line pair BbP. The power line group PG may include a plurality of power lines PL. Each of the plurality of power lines PL may be spaced apart from each other in the first direction X with a predetermined interval therebetween, and may extend in the second direction Y.

Each of the plurality of power lines PL may apply a power voltage VDD or a ground voltage VSS to the bit cell BC. For example, the power line group PG may include four power lines PL. When described in the order of the first direction X, the four power lines PL may apply a voltage to the bit cell BC in the order of a ground voltage VSS, a power voltage VDD, a power voltage VDD, and a ground voltage VSS. However, the disclosure is not limited thereto, and in another example embodiment, the four power lines PL may alternately apply the power voltage VDD and the ground voltage VSS to the bit cell BC. That is, voltages may be applied to the four power lines PL in the order of a ground voltage VSS, a power supply voltage VDD, a ground voltage VSS, and a power supply voltage VDD.

The bit cell BC may be connected to the first word line WLA and the second word line WLB. The first word line WLA and the second word line WLB may be spaced apart from each other in the first direction X. The first word line WLA and the second word line WLB may extend in the second direction Y.

The first word line WLA may be provided between the bit line pair BP. That is, the first word line WLA may be provided between the first bit line BLA and the second bit line BLB. The second word line WLB may be provided between the complementary bit line pair BbP. That is, the second word line WLB may be provided between the first complementary bit line BLAb and the second complementary bit line BLBb. In this embodiment, one word line is provided between the bit line pair BP and the complementary bit line pair BbP, but is not limited thereto, and in another embodiment, two or more word lines may be provided between a bit line pair or a complementary bit line pair.

The bit line pair BP, the complementary bit line pair BbP, the power line group PG, the first word line WLA, and the second word line WLB may be formed on the same layer from the substrate. The bit line pair BP, the complementary bit line pair BbP, the power line group PG, the first word line WLA, and the second word line WLB may be formed of the same wiring. This will be described in detail with reference to FIG. 6.

The first metal wiring ML1 and the second metal wiring ML2 may be provided on the bit line pair BP. The first metal wiring ML1 and the second metal wiring ML2 may be spaced apart from each other in the second direction Y, and may extend in the first direction X. The first metal wiring ML1 and the second metal wiring ML2 may cross the bit line pair BP and the complementary bit line pair BbP. The first metal wiring ML1 and the second metal wiring ML2 may include a metal material having excellent electrical conductivity. In an example embodiment, the first metal wiring ML1 and the second metal wiring ML2 may be connected to an external power source.

The via V1 may be formed on the first word line WLA and the second word line WLB. The via V1 may be formed of a metal material having excellent electrical conductivity. The via V1 may connect the first word line WLA to the first metal wiring ML1 and may connect the second word line WLB to the second metal wiring ML2. Accordingly, the first word line WLA and the first metal wiring ML1 may be electrically connected to each other, and the second word line WLB and the second metal wiring ML2 may be electrically connected to each other. That is, the voltages applied to the first metal wiring ML1 and the second metal wiring ML2 may be respectively transmitted to the first word line WLA and the second word line WLB through the via V1.

The first word line WLA and the second word line WLB may be cut by the cutting area M1 CUT. That is, the first word line WLA and the second word line WLB may extend in the second direction Y, and may be partially cut off by the cutting area M1 CUT. Accordingly, the voltage transmitted from the metal wirings ML1 and ML2 to the word lines WLA and WLB may not be shared with the bit cell BC and other bit cells adjacent in the second direction Y. In FIG. 2, the cutting area M1 CUT is illustrated only on the second word line WLB, but is not limited thereto and may also be formed on the first word line WLA. For example, a cutting area M1 CUT for cutting the first word line WLA may be formed in another bit cell adjacent to the bit cell BC in the second direction Y.

Because the second word line WLB is formed under the second metal wiring ML2, and the cutting area M1 CUT is formed in a portion overlapping the second word line WLB and the second metal wiring ML2, although the second word line WLB may appear to be continuous in the layout diagram, substantially, the second word line WLB may be partially discontinuous under the second metal wiring ML2. Because the word lines WLA and WLB include the cutting area M1 CUT, a plurality of voltages may be applied to the word lines WLA and WLB extending in the second direction Y.

As the first word line WLA is provided between the bit line pair BP, and the second word line WLB is provided between the complementary bit line pair BbP, the bit cell BC according to the example embodiment may shield the bit line pair BP and the complementary bit line pair BbP. Accordingly, crosstalk occurring between the first bit line BLA and the second bit line BLB and between the first complementary bit line BLAb and the second complementary bit line BLBb is minimized, or can be prevented, and an integrated circuit 100 that performs a stable operation may be provided. In addition, as coupling between the bit line pair BP and the complementary bit line pair BbP is improved, the operating speed of the integrated circuit 100 may be improved.

Hereinafter, transistors constituting the bit cell BC and provided under the bit line pair BP will be described in detail.

Figure 3:
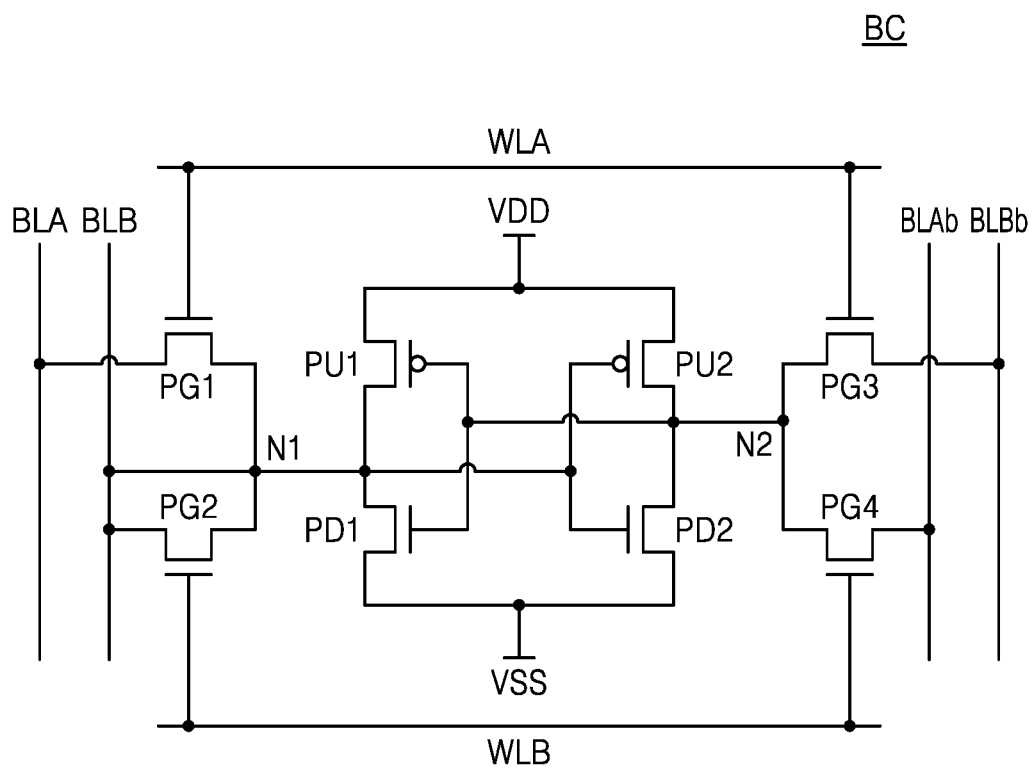
FIG. 3 is a circuit diagram of a dual port SRAM according to example embodiments.

FIG. 3 is a circuit diagram of a bit cell according to an example embodiment. Specifically, it is an equivalent circuit diagram of a DPSRAM cell according to an example embodiment.

Referring to FIG. 3, the bit cell BC may include a first pass transistor PG1, a second pass transistor PG2, a third pass transistor PG3, a fourth pass transistor PG4, a first pull-up transistor PU1, a second pull-up transistor PU2, a first pull-down transistor PD1, and a second pull-down transistor PD2.

The first to fourth pass transistors PG1, PG2, PG3, and PG4 and the first and second pull-down transistors PD1 and PD2 may be N-type transistors, and the first and second pull-up transistors PU1 and PU2 may be P-type transistors.

The first pull-up transistor PU1 and the first pull-down transistor PD1 may constitute a first inverter, and the second pull-up transistor PU2 and the second pull-down transistor PD2 may constitute a second inverter.

Specifically, the drain terminal of the first pull-up transistor PU1 may be connected to the drain terminal of the first pull-down transistor PD1, and the gate of the first pull-up transistor PU1 may be electrically connected to the gate of the first pull-down transistor PD1. The power supply voltage VDD may be applied to the source terminal of the first pull-up transistor PU1, and the ground voltage VSS may be applied to the source terminal of the first pull-down transistor PD1. Accordingly, the first pull-up and first pull-down transistors PU1 and PD1 may constitute the first inverter.

Similarly, the drain terminal of the second pull-up transistor PU2 may be connected to the drain terminal of the second pull-down transistor PD2, and the gate of the second pull-up transistor PU2 may be electrically connected to the gate of the second pull-down transistor PD2. A power supply voltage VDD may be applied to a source terminal of the second pull-up transistor PU2, and a ground voltage VSS may be applied to a source terminal of the second pull-down transistor PD2. Accordingly, the second pull-up and second pull-down transistors PU2 and PD2 may constitute the second inverter.

The gate of the first pull-up transistor PU1 and the gate of the first pull-down transistor PD1, connected to each other, may correspond to the input terminal of the first inverter, and the first node N1 connected to the drain terminal of the first pull-up transistor PU1 and the drain terminal of the first pull-down transistor PD1 may correspond to the output terminal of the first inverter.

The gate of the second pull-up transistor PU2 and the gate of the second pull-down transistor PD2, connected to each other, may correspond to the input terminal of the second inverter, and the second node N2 connected to the drain terminal of the second pull-up transistor PU2 and the drain terminal of the second pull-down transistor PD2 may correspond to the output terminal of the second inverter.

The first inverter and the second inverter may be coupled to each other in a latch structure. That is, the gate of the first pull-up transistor PU1 and the gate of the first pull-down transistor PD1 may be connected to the second node N2, and a gate of the second pull-up transistor PU2 and a gate of the second pull-down transistor PD2 may be connected to the first node N1.

A drain terminal of the first pass transistor PG1 and a source terminal of the second pass transistor PG2 may be connected to the first node N1. The source terminal of the first pass transistor PG1 may be connected to the first bit line BLA, and the drain terminal of the second pass transistor PG2 may be connected to the second bit line BLB. That is, the first pass transistor PG1 and the second pass transistor PG2 may be connected to the first node N1.

Similarly, the drain terminal of the third pass transistor PG3 and the source terminal of the fourth pass transistor PG4 may be connected to the second node N2. The source terminal of the third pass transistor PG3 may be connected to the first complementary bit line BLAb, and the drain terminal of the fourth pass transistor PG4 may be connected to the second complementary bit line BLBb. That is, the third pass transistor PG3 and the fourth pass transistor PG4 may be connected to the second node N2.

The gate of the first pass transistor PG1 and the gate of the third pass transistor PG3 may be connected to the first word line WLA, and the gate of the second pass transistor PG2 and the gate of the fourth pass transistor PG4 may be connected to the second word line WLB.

According to an example embodiment of the disclosure, the bit cell BC may include a first pass transistor PG1 and a second pass transistor PG2 connected to the first node N1 and a third pass transistor PG3 and a fourth pass transistor PG4 connected to the second node N2 to implement a dual port.

Specifically, by using the first word line WLA, the first bit line BLA, and the first complementary bit line BLAb, logical data may be written into the first node N1 and the second node N2, or logical data stored in the first node N1 and the second node N2 may be read. Similarly, by using the second word line WLB, the second bit line BLB and the second complementary bit line BLBb, logical data may be written into the first node N1 and the second node N2, or logical data stored in the first node N1 and the second node N2 may be read. The bit cell BC may simultaneously perform a write operation and a read operation through the dual port.

Figure 4:
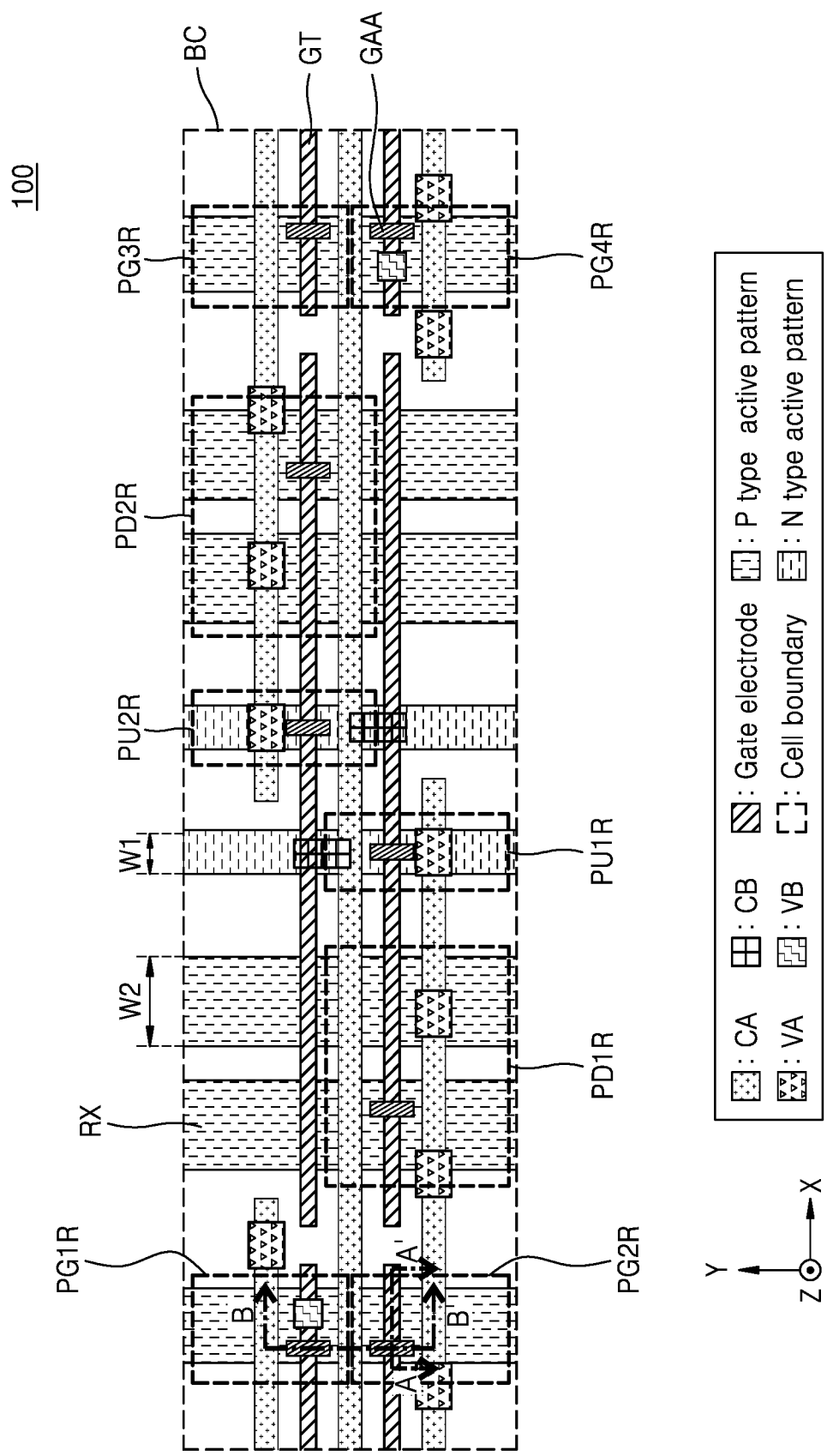
FIG. 4 is a layout diagram of a bit cell according to an example embodiment.
Figure 5:
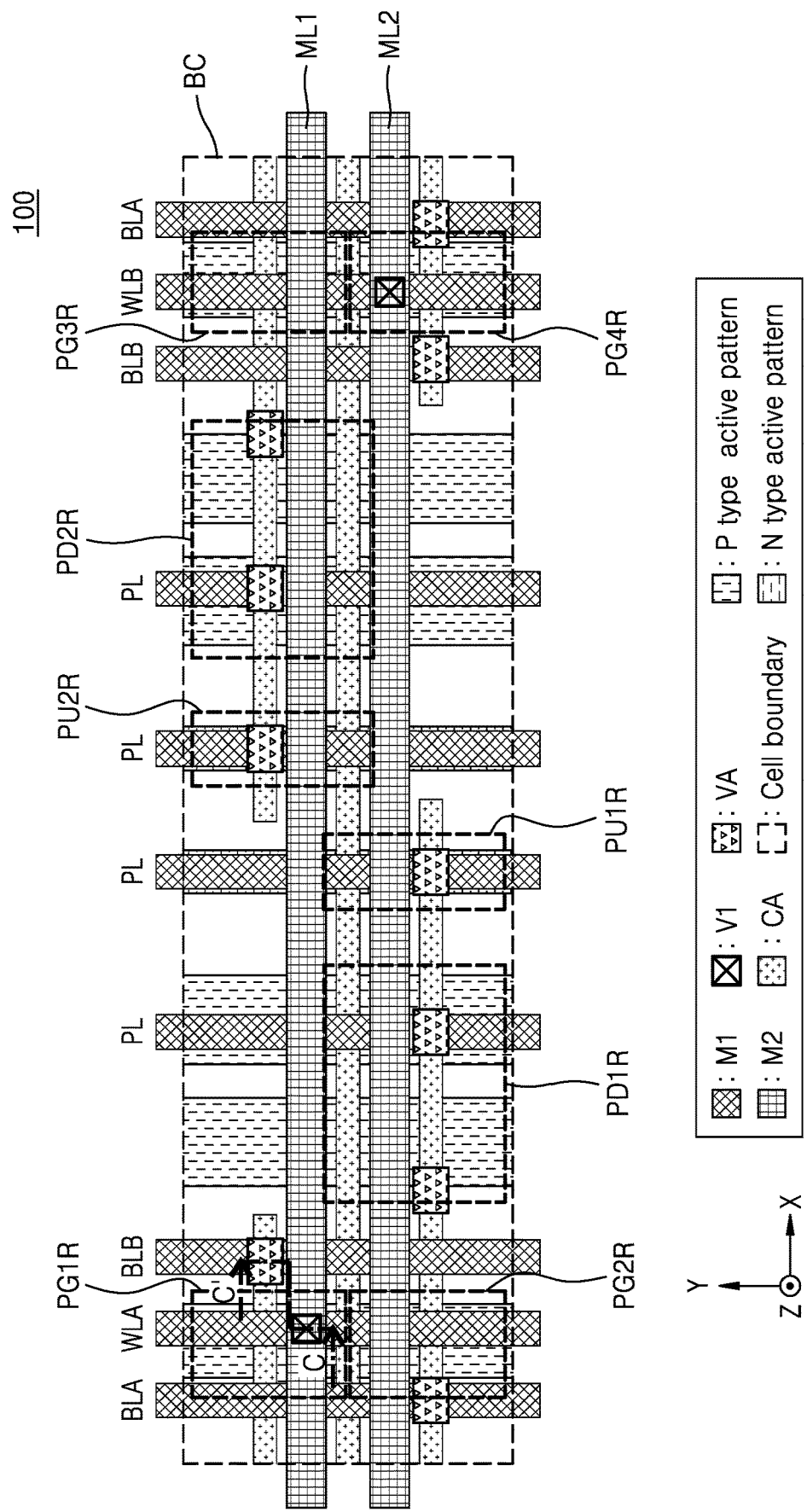
FIG. 5 is a layout diagram of a bit cell according to an example embodiment.

FIGS. 4 and 5 are layout diagrams of bit cells according to example embodiments. In detail, FIG. 4 is a diagram for explaining the transistors of the bit cell BC described with reference to FIGS. 2 and 3, and FIG. 5 is a diagram for explaining bit lines, word lines, and metal wirings connected to word lines provided on a transistor. Hereinafter, it will be described with reference to FIGS. 2 and 3.

Referring to FIG. 4, the bit cell BC may include a first pass transistor area PG1R, a second pass transistor area PG2R, a third pass transistor area PG3R, a fourth pass transistor area PG4R, a first pull-up transistor area PU1R, a second pull-up transistor area PU2R, a first pull-down transistor area PD1R, and a second pull-down transistor area PD2R.

The first pass transistor area PG1R, the second pass transistor area PG2R, the third pass transistor area PG3R, the fourth pass transistor area PG4R, the first pull-up transistor area PU1R, the second pull-up transistor area PU2R, the first pull-down transistor area PD1R and the second pull-down transistor area PD2R may be respective areas where the first pass transistor PG1, the second pass transistor PG2, the third pass transistor PG3, the fourth pass transistor PG4, the first pull-up transistor PU1, the second pull-up transistor PU2, the first pull-down transistor PD1, and the second pull-down transistor PD2 described with reference to FIG. 3 are formed.

The first pass transistor area PG1R and the second pass transistor area PG2R may be adjacent to each other in the second direction Y. The third pass transistor area PG3R and the fourth pass transistor area PG4R may be adjacent to each other in the second direction Y. The first pass transistor area PG1R and the third pass transistor area PG3R may be spaced apart from each other in the first direction X. The second pass transistor area PG2R and the fourth pass transistor area PG4R may be spaced apart from each other in the first direction X.

The first pull-up transistor area PU1R and the second pull-up transistor area PU2R may be provided between the first pass transistor area PG1R and the third pass transistor area PG3R and between the second pass transistor area PG2R and the fourth pass transistor area PG4R. Specifically, the first pull-up transistor area PU1R may be provided relatively closer to the second pass transistor area PG2R than the second pull-up transistor area PU2R, and the second pull-up transistor area PU2R may be provided relatively closer to the third pass transistor area PG3R than the first pull-up transistor area PU1R. The first pull-up transistor area PU1R and the second pull-up transistor area PU2R may be provided on different axes in the second direction Y. The first pull-up transistor area PU1R and the second pull-up transistor area PU2R may be provided adjacent to each other in the first direction X with a predetermined space therebetween.

A first pull-down transistor area PD1R may be provided between the second pass transistor area PG2R and the first pull-up transistor area PU1R. The first pull-down transistor area PD1R may be spaced apart from the second pass transistor area PG2R and the first pull-up transistor area PU1R. An area of the first pull-down transistor area PD1R may be greater than an area of each of the second pass transistor area PG2R and the first pull-up transistor area PU1R.

A second pull-down transistor area PD2R may be provided between the third pass transistor area PG3R and the second pull-up transistor area PU2R. The second pull-down transistor area PD2R may be spaced apart from the third pass transistor area PG3R and the second pull-up transistor area PU2R. An area of the second pull-down transistor area PD2R may be greater than an area of the third pass transistor area PG3R and the second pull-up transistor area PU2R.

The bit cell BC may include a plurality of active patterns RX. The plurality of active patterns RX may be provided to be spaced apart from each other in the first direction X, and each may extend in the second direction Y. Each of the plurality of active patterns RX may be a P-type active pattern in which an N-type transistor is formed or an N-type active pattern in which a P-type transistor is formed.

The active patterns RX may have various widths in the first direction X. For example, the width W1 of the active pattern formed in the first pull-up transistor area PU1R may be narrower than the width W2 of the active pattern formed in the first pull-down transistor area PD1R. The first pull-down transistor area PD1R and the second pull-down transistor area PD2R may include two active patterns spaced apart from each other in the first direction X.

A plurality of transistors may be formed in the plurality of active patterns RX. The transistors may be a fin field effect FET (FinFET) formed by an active pattern extending in the form of a fin and a gate electrode, may be a gate-all-around FET (GAAFET) formed by a plurality of nanowires extending parallel to each other and a gate electrode, or may be a multi-bridge channel FET (MBCFET) formed by a plurality of nanosheets extending parallel to each other and a gate electrode.

The transistors may include a Forksheet FET (ForkFET) having a structure in which an N-type transistor and a P-type transistor are adjacent as the nanosheets for the P-type transistor and the nanosheets for the N-type transistor are separated by a dielectric wall. The transistors may include a vertical FET (VFET) including source area and drain area spaced apart from each other in the Z-axis direction and a gate electrode surrounding the channel area. In addition to a field effect transistor (FET) such as a complementary FET (CFET), a negative FET (NCFET), a carbon nanotube (CNT) FET, and the like, transistors may include bipolar junction transistors and other three-dimensional transistors.

In this example embodiment, the transistors may be described below as being GAAFETs, but they are not limited thereto. The transistor will be described in detail with reference to FIG. 11.

The plurality of gate electrodes GT may be spaced apart from each other in the second direction Y, and may extend in the first direction X. Accordingly, the plurality of gate electrodes GT may partially overlap the plurality of active patterns RX. The plurality of gate electrodes GT may have a structure corresponding to gate ends of transistors formed in the plurality of active patterns RX, and the plurality of gate electrodes GT and the plurality of active patterns RX may form a plurality of transistors. Two gate electrodes GT per one bit cell BC may be spaced apart from each other.

The plurality of gate electrodes GT extend in the first direction X, but may be partially discontinuous. A voltage may be applied to the plurality of gate electrodes GT through the gate contact CB and the gate via VB. When only the gate via VB is illustrated in the drawing, the gate contact CB provided under the gate via VB may be omitted.

The plurality of gate electrodes GT may include a conductive material. For example, the plurality of gate electrodes GT may include at least one of semiconductor materials (e.g., doped silicon, doped germanium, doped silicon-germanium, etc.), metals (e.g., tungsten, aluminum, etc.), metal compounds (e.g., metal silicides, etc.), conductive metal nitride (e.g., titanium nitride, tantalum nitride, tungsten nitride, etc.) or transition metals (e.g., titanium, tantalum, etc.).

GAA patterns GAA may be provided on the plurality of active patterns RX. The GAA patterns GAA may partially overlap the gate electrodes GT. The GAA patterns GAA may be formed at positions where the plurality of active patterns RX intersect with the gate electrodes GT. The GAA patterns GAA may include a plurality of nanowires or a plurality of nanosheets. In this case, the transistors may be a GAAFET including a plurality of nanowires or nanosheets. The GAA patterns GAA are not limited to that illustrated in FIG. 4, and a greater number of GAA patterns GAA than the illustrated number may be formed, and a planar shape may be formed in various shapes.

A plurality of source/drain contacts CA may be formed on the plurality of active patterns RX. The source/drain contact CA may extend in the first direction X. A source/drain via VA may be formed on the source/drain contact CA. The source/drain contact CA may extend in the first direction X and may be partially discontinuous. The source/drain contact CA may be provided between the plurality of gate electrodes GT. Accordingly, the source/drain contact CA and the plurality of gate electrodes GT may not overlap. The source/drain contact CA and the source/drain via VA may be electrically connected. The source/drain contact CA and the source/drain via VA may transmit a voltage provided to define the source area and the drain area of the transistor to the source/drain area of the transistor.

Referring to FIG. 5, bit lines BLA and BLB, complementary bit lines BLAb and BLBb, power lines PL, and word lines WLA and WLB may be provided on the plurality of gate electrodes GT. The bit lines BLA and BLB, the complementary bit lines BLAb and BLBb, the power lines PL, and the word lines WLA and WLB may be spaced apart from each other in the first direction X, and may extend in the second direction Y. According to an example embodiment, as described above with reference to FIG. 2, the word lines WLA and WLB may include a cutting area M1 CUT.

Metal wirings ML1 and ML2 may be provided on the bit lines BLA and BLB. The metal wirings ML1 and ML2 may be spaced apart from each other in the second direction Y and may extend in the first direction X. The metal wirings ML1 and ML2 may overlap the plurality of gate electrodes GT in the third direction Z. Accordingly, the gate electrodes GT may be omitted in the drawing.

For convenience of illustration, the first via VA are shown despite being positioned under the metal wirings ML1 and ML2. The metal wirings ML1 and ML2 may be electrically connected to the word lines WLA and WLB using the first via V1. The first metal wiring ML1 may be connected to the first word line WLA through the first via V1, and the second metal wiring M2 may be connected to the second word line WLB through the first via V1.

Hereinafter, in order to help the understanding of the integrated circuit 100 illustrated in FIGS. 4 and 5, a stacked structure along the line C-C' of FIG. 5 will be described.

Figure 6:
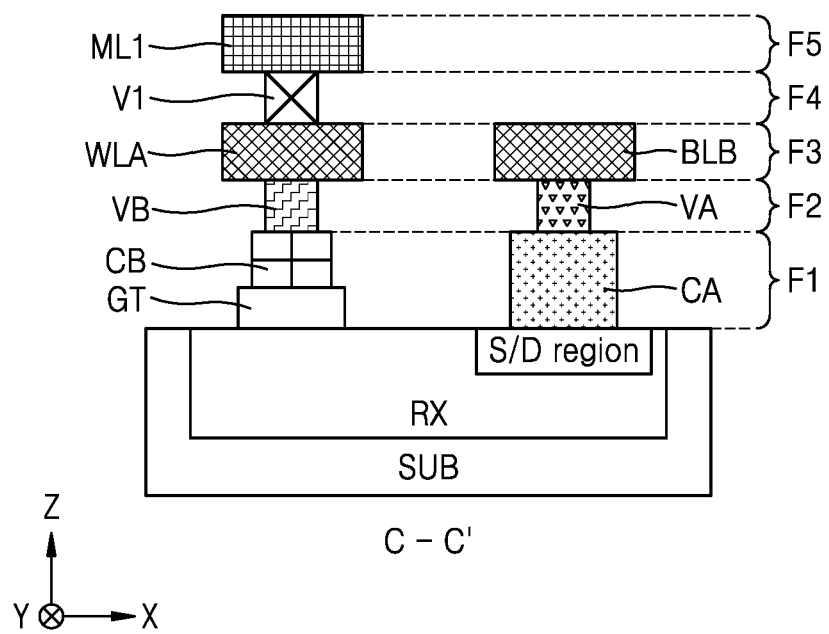
FIG. 6 is a cross-sectional view taken along the line C-C' of FIG. 5.

FIG. 6 is a cross-sectional view taken along the line C-C' of FIG. 5. In detail, as a schematic diagram for explaining the stacked structure of FIGS. 4 and 5, the transistor is omitted for convenience of description, and the sizes of the gate electrode GT, the contacts CA and CB, the vias VA, VB, and V1, the first word line WLA, the second bit line BLB, and the first metal wiring ML1 are shown arbitrarily. Accordingly, FIG. 6 may be different from a cross-sectional view of an actual bit cell BC.

Referring to FIG. 6, a gate contact CB connected to the gate electrode GT and a source/drain contact CA connected to the source/drain area of the transistor may be formed on the first layer F1. The first layer F1 may be referred to as a 'contact layer' or an 'M0 layer'. The bit cell BC and the first layer F1 may be formed in a front end-of-line (FEOL) process.

A gate via VB connected to the gate contact CB and a source/drain via VA connected to the source/drain contact CA may be formed in the second layer F2. The second layer F2 may be referred to as a 'contact via layer' or a 'V0 layer'.

A first word line WLA and a second bit line BLB may be formed on the third layer F3. As described above, the bit line pair BP, the complementary bit line pair BbP, the power line group PG, and the word lines WLA and WLB may be formed on the same layer, and for example, may be formed on the third layer F3. The third layer F3 may be referred to as a 'first wiring layer' or an 'M1 layer'. The bit line pair BP, the complementary bit line pair BbP, the power line group PG, and the word lines WLA and WLB may be referred to as 'first wiring'.

A first via V1 may be formed in the fourth layer F4. The first via V1 may be connected to the first word line WLA. The fourth layer may be referred to as a 'first via layer'.

A first metal wiring ML1 may be formed on the fifth layer F5. According to an example embodiment, as described above, the second metal wiring ML2 may be formed on the same wiring layer as the first metal wiring ML1, and for example, the second metal wiring ML2 may also be formed on the fifth layer F5. The fifth layer F5 may be referred to as a 'second wiring layer' or an 'M2 layer'. The first and second metal wirings ML1 and ML2 may be referred to as 'second wiring'.

Although FIG. 6 illustrates first layer F1 to the fifth layer F5, the disclosure is not limited thereto, and as such, according to another example embodiment, a second via layer, a third wiring layer, a third via layer, a fourth wiring layer, etc. may be further formed on the fifth layer F5. The second to fifth layers F2 to F5 may be formed in a back end-of-line (BEOL) process. The contact area may decrease from the second layer F2 to the fifth layer F5.

Figure 7:
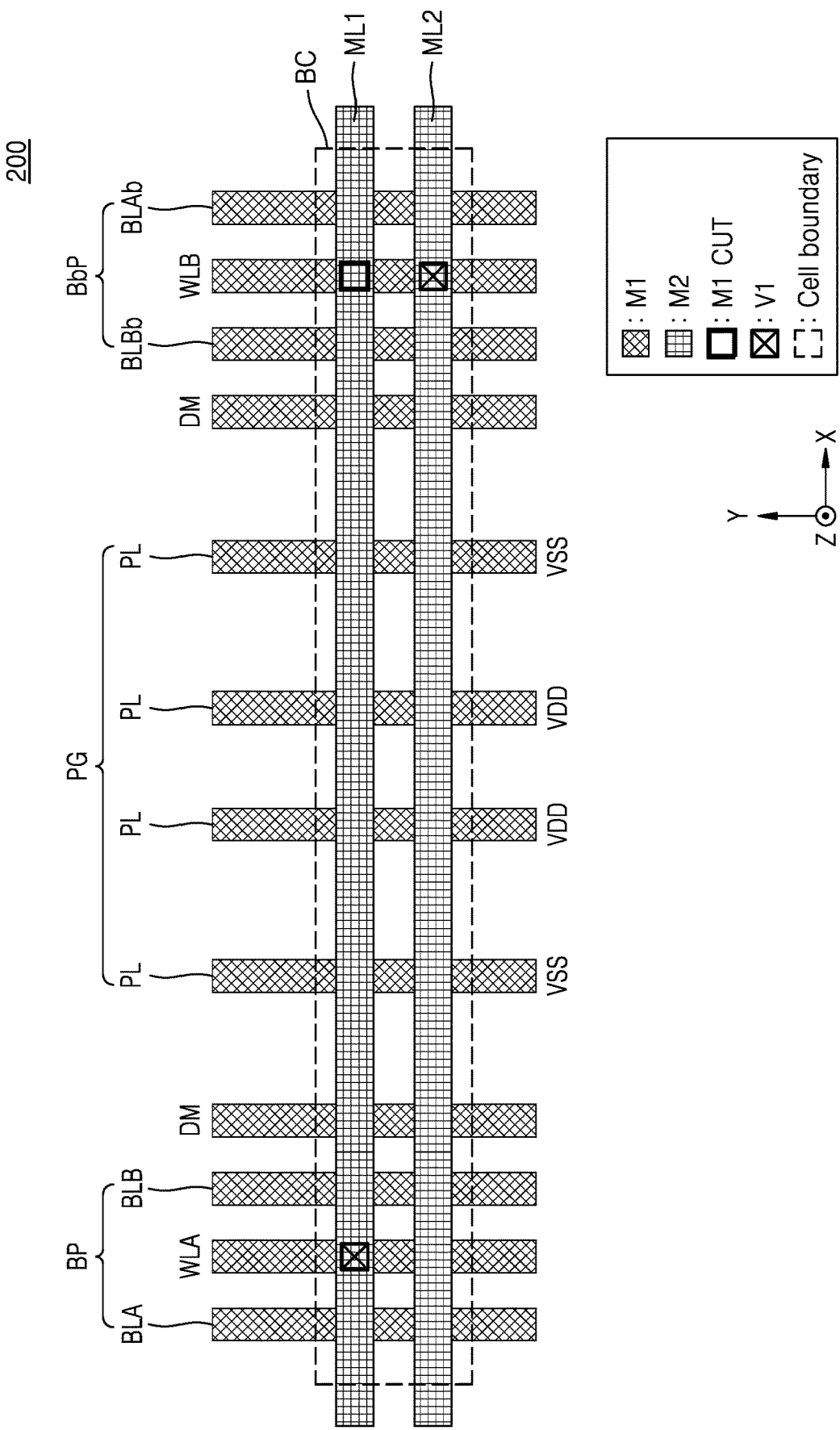
FIG. 7 is a layout diagram of a bit cell according to an example embodiment.

FIG. 7 is a layout diagram of a bit cell according to another example embodiment. For the sake of convenience, repeated descriptions from the illustration in FIG. 2 are omitted.

Referring to FIG. 7, the integrated circuit 200 may further include a dummy line DM.

The dummy line DM may be formed to extend in the second direction Y. The dummy line DM may be provided between the bit line pair BP and the power line group PG or may be provided between the complementary bit line pair BbP and the power line group PG.

The dummy line DM may be electrically independent from the bit cell BC. The dummy line DM may be a power line electrically independent from the bit cell BC. That is, the dummy line DM is not electrically connected to the bit cell BC, but may be electrically connected to another bit cell adjacent to the bit cell BC in the second direction Y. According to an embodiment, the dummy line DM may be electrically connected to the bit cell BC and other bit cells spaced apart from each other at a predetermined distance in the second direction Y. Accordingly, the dummy line DM may apply a power supply voltage VDD or a ground voltage VSS to other bit cells. According to an embodiment, a power supply voltage VDD or a ground voltage VSS is applied to the dummy line DM, but a voltage may not be provided to a bit cell other than the bit cell BC, and alternatively, no voltage may be applied.

The integrated circuit 200 may include various numbers of dummy lines DM. Although FIG. 7 illustrates that two dummy lines DM are included, the disclosure is not limited thereto, and as such, according to another example embodiment, one dummy line may be included or two or more dummy lines DM may be included. According to an example embodiment, one or more dummy lines DM may be provided between the bit line pair BP and the power line group PG.

In this example embodiment, by including at least one dummy line DM provided between the bit line pair BP and the power line group PG or provided between the complementary bit line pair BbP and the power line group PG, at least one of the second bit line BLB and the second complementary bit line BLBb may be shielded. Accordingly, coupling of the bit line pair BP and the complementary bit line pair BbP may be minimized or prevented, and the integrated circuit 200 that performs a stable operation may be provided.

Figure 8:
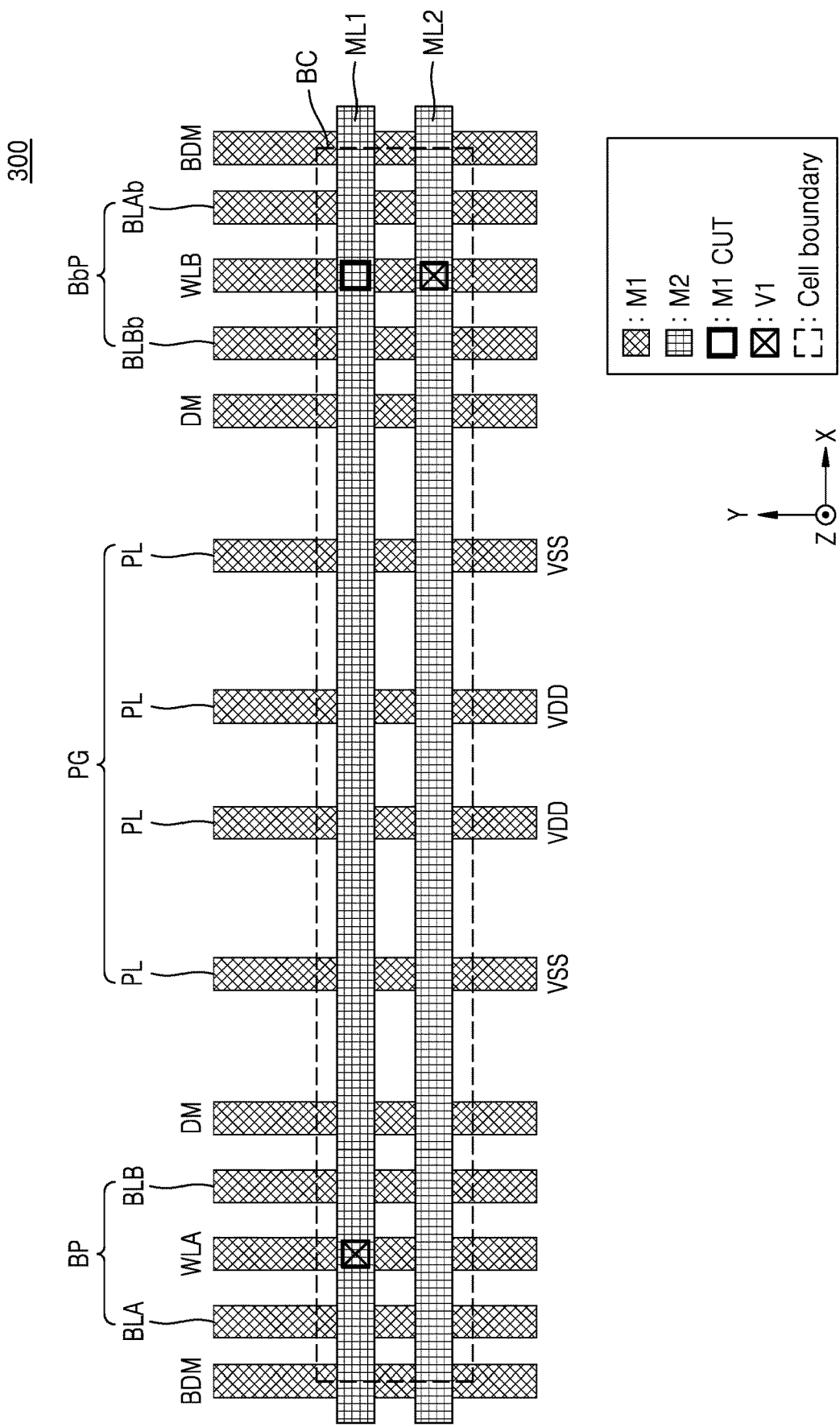
FIG. 8 is a layout diagram of a bit cell according to an example embodiment.

FIG. 8 is a layout diagram of a bit cell according to another example embodiment. For the same of convenience, repeated descriptions from the illustration in FIGS. 2 and 7 are omitted.

Referring to FIG. 8, an integrated circuit 300 may further include a boundary dummy line BDM.

The boundary dummy line BDM may be formed to extend in the second direction Y. The boundary dummy line BDM may be provided at a boundary between the bit cell BC and another bit cell adjacent in the first direction X. Accordingly, the boundary dummy line BDM may be provided between the first bit line BLA of the bit cell BC and the first complementary bit line BLAb of another bit cell adjacent to the bit cell BC in the first direction X.

The boundary dummy line BDM may be electrically independent from the bit cell BC. The boundary dummy line BDM may be a power line electrically independent from the bit cell BC. That is, the boundary dummy line BDM is not electrically connected to the bit cell BC, but may be electrically connected to another bit cell adjacent to the bit cell BC in the second direction Y. According to an embodiment, the boundary dummy line BDM may be electrically connected to the bit cell BC and other bit cells spaced apart from each other at a predetermined distance in the second direction Y. Accordingly, the boundary dummy line BDM may apply a power supply voltage VDD or a ground voltage VSS to other bit cells. According to an embodiment, a power supply voltage VDD or a ground voltage VSS is applied to the boundary dummy line BDM, but a voltage may not be provided to a bit cell other than the bit cell BC, and alternatively, no voltage may be applied.

The integrated circuit 300 may include a variable number of boundary dummy lines BDM. In FIG. 8, it is illustrated that two boundary dummy lines BDM are included, but the disclosure is not limited thereto, and as such, according to another example embodiment, the integrated circuit may include only one boundary dummy line or the integrated circuit may include two or more boundary dummy lines. According to an example embodiment, one or more boundary dummy lines BDM may be provided between the bit cells BC.

In this example embodiment, by including at least one boundary dummy line BDM provided at a boundary between the bit cell BC and another bit cell adjacent in the first direction X, at least one of the first bit line BLA and the first complementary bit line BLAb may be shielded. Accordingly, coupling of the bit line pair BP and the complementary bit line pair BbP may be minimized or prevented, and the integrated circuit 300 that performs a stable operation may be provided.

Figure 9:
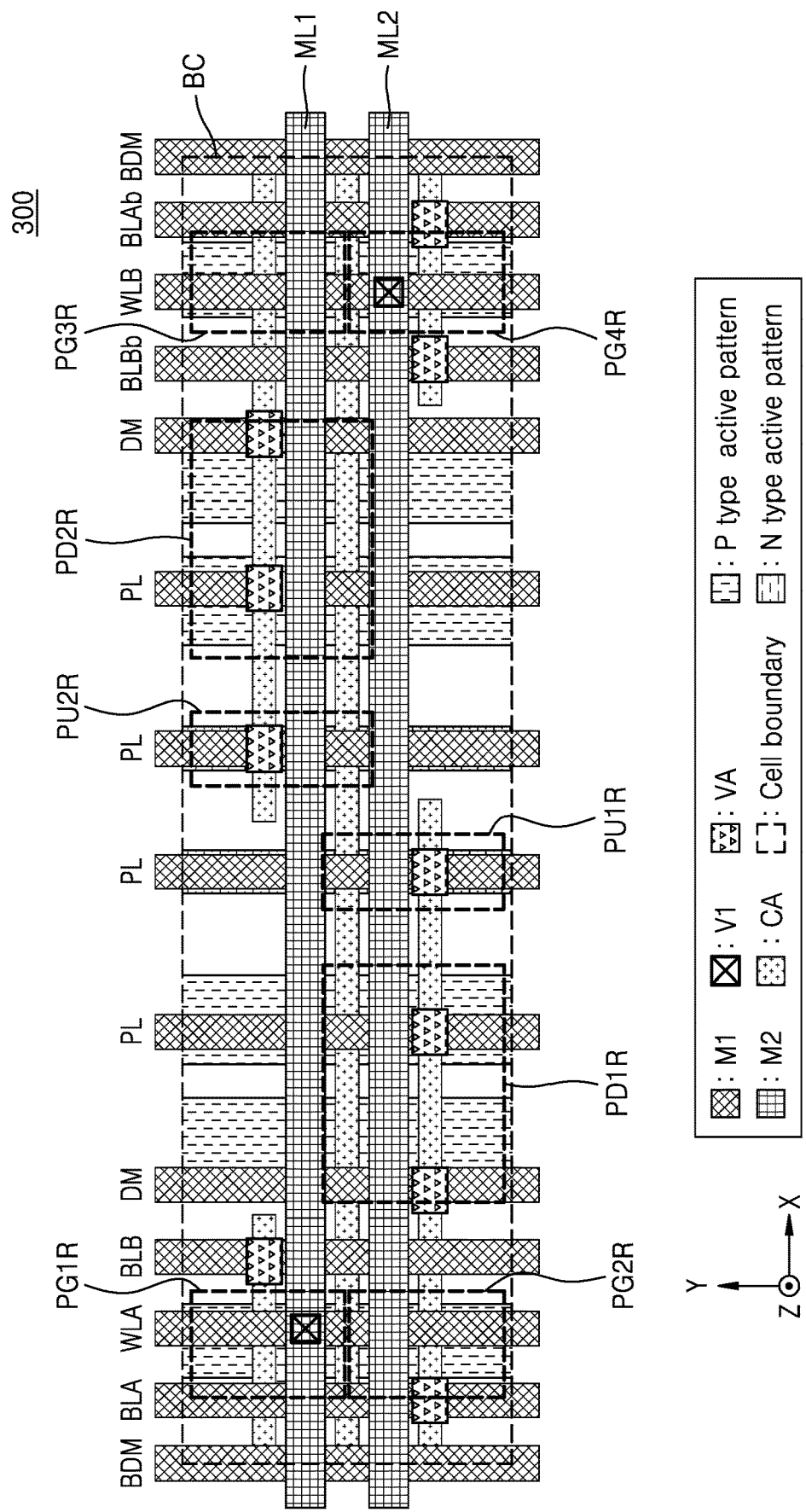
FIG. 9 is a layout diagram of a bit cell according to an example embodiment.

FIG. 9 is a layout diagram of a bit cell according to another example embodiment. In detail, FIG. 9 is a diagram for explaining the integrated circuit 300 of FIG. 8. Hereinafter, it will be described with reference to FIGS. 4 to 8.

Referring to FIG. 9, the integrated circuit 300 may include a bit cell BC. The bit cell BC may be the same as the bit cell BC described above with reference to FIGS. 4 and 5. According to an example embodiment, the dummy line DM and the boundary dummy line BDM may be omitted as shown in FIG. 5.

The integrated circuit 300 may further include a dummy line DM and a boundary dummy line BDM. The dummy line DM and the boundary dummy line BDM may be electrically independent from the bit cell BC. That is, the dummy line DM and the boundary dummy line BDM only extend in the second direction Y on the bit cell BC, and the bit cell BC may not include a contact or a via connected to the dummy line DM and the boundary dummy line BDM.

The dummy line DM and the boundary dummy line BDM may be formed on the same wiring layer as the bit lines BLA, BLB, BLAb, and BLBb, the word lines WLA and WLB, and the power lines PL. Referring to FIG. 6, the dummy line DM and the boundary dummy line BDM may be formed in the third layer F3. When the integrated circuit 300 further includes a dummy line DM and a boundary dummy line BDM, the 'first wiring' may further include a dummy line DM and a boundary dummy line BDM in addition to the bit line pair BP, the complementary bit line pair BbP, the power line group PG, and the word lines WLA and WLB.

Figure 10:
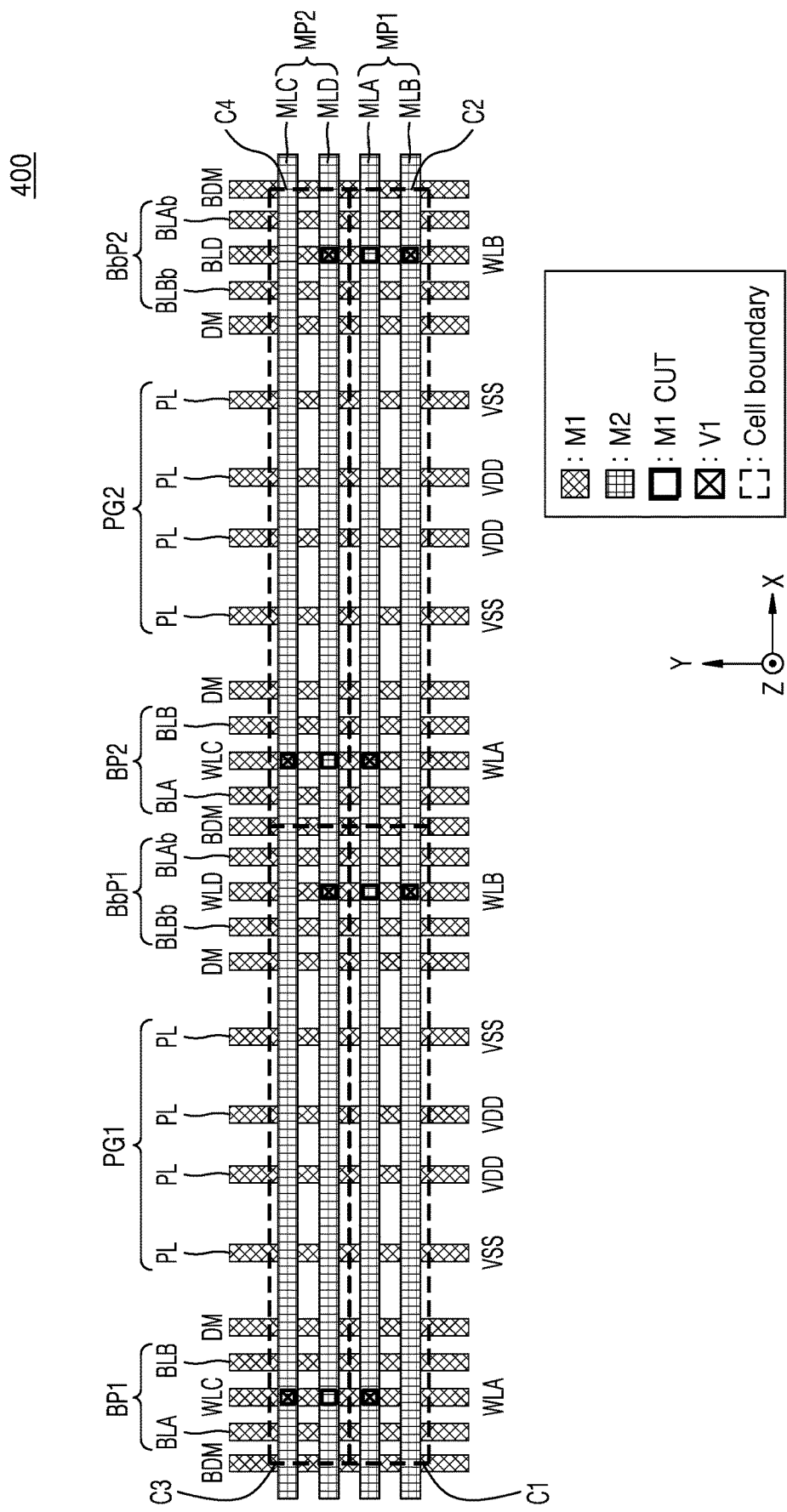
FIG. 10 is a layout diagram of a bit cell according to an example embodiment.

FIG. 10 is a layout diagram of a bit cell according to another example embodiment. In detail, FIG. 10 is a layout diagram of an integrated circuit 400 including a plurality of bit cells C1, C2, C3, and C4. It will be described with reference to FIGS. 2 to 9.

Referring to FIG. 10, the integrated circuit 400 may include a plurality of bit cells C1, C2, C3, and C4. The plurality of bit cells C1, C2, C3, and C4 may be provided adjacent to each other. The first bit cell C1 may be adjacent to the second bit cell C2 in the first direction X and may be adjacent to the third bit cell C3 in the second direction Y. The fourth bit cell C4 may be adjacent to the second bit cell C2 in the second direction Y and may be adjacent to the third bit cell C3 in the first direction X.

Each of the plurality of bit cells C1, C2, C3, and C4 may include active patterns and transistors formed in the active patterns as described above with reference to FIGS. 3 and 4. Because the active patterns may extend in the second direction Y, bit cells neighboring in the second direction Y, for example, the first bit cell C1 and the third bit cell C3, may share the active patterns.

The plurality of bit cells C1, C2, C3, and C4, as described above with reference to FIG. 2, may be connected to the bit line pairs BP1 and BP2, the complementary bit line pairs BbP1 and BbP2, the power line groups PG1 and GP2, and the word lines WLA, WLB, WLC, and WLD. The word lines WLA, WLB, WLC, and WLD may be provided between the bit line pairs BP1 and BP2 or between the complementary bit line pairs BbP1 and BbP2. Accordingly, the bit line pairs BP1 and BP2 or the complementary bit line pairs BbP1 and BbP2 may be shielded by the word line.

Bit cells neighboring in the second direction Y may share the bit line pair BP1 and BP2 and the complementary bit line pair BbP1 and BbP2. For example, the first bit cell C1 and the third bit cell C3 may share the first bit line pair BP1 and the first complementary bit line pair BbP1, and the second bit cell C2 and the fourth bit cell C4 may share the second bit line pair BP2 and the second complementary bit line pair BbP2. That is, the first bit cell C1 and the third bit cell C3 may be connected to the first bit line pair BP1 and the first complementary bit line pair BbP1, respectively, and the second bit cell C2 and the fourth bit cell C4 may be connected to the second bit line pair BP2 and the second complementary bit line pair BbP2, respectively.

The first metal pair MP1 may include a first metal line MLA and a second metal line MLB, and the second metal pair MP2 may include a third metal line MLC and a fourth metal line MLD. Bit cells neighboring in the first direction X may share the metal pairs MP1 and MP2. For example, the first bit cell C1 and the second bit cell C2 may share the first metal pair MP1, and the third bit cell C3 and the fourth bit cell C4 may share the second metal pair MP2. That is, each of the first bit cell C1 and the second bit cell C2 may be connected to the first metal pair MP1, and each of the third bit cell C3 and the fourth bit cell C4 may be connected to the second metal pair MP2.

The metal pairs MP1 and MP2 may be connected to the word lines WLA, WLB, WLC, and WLD through the first via V1. The word lines WLA, WLB, WLC, and WLD may be separated by a cutting area M1 CUT. For example, the first word line WLA of the first bit cell C1 and the third word line WLC of the third bit cell C3 may be separated by a cutting area M1 CUT formed in the third bit cell C3. Accordingly, different voltages may be applied to the first word line WLA and the third word line WLC by the first metal wiring MLA and the third metal wiring MLC. A cutting area M1 CUT may be formed at the same position in bit cells adjacent to each other in the first direction X. For example, the first bit cell C1 and the second bit cell C2 may include a cutting area M1 CUT formed at the same location.

That is, bit cells neighboring in the second direction Y may share the bit line pair BP1 and BP2 and the complementary bit line pair BbP1 and BbP2, and bit cells neighboring in the first direction X may share the metal pairs MP1 and MP2. A write operation or a read operation may be performed on the plurality of bit cells C1, C2, C3, and C4 through the bit line pairs BP1 and BP2, the bit line bar pairs BbP1 and BbP2, and the metal pairs MP1 and MP2.

As described above in FIGS. 7 and 8, the integrated circuit 400 may further include a dummy line DM and a boundary dummy line BDM crossing the plurality of bit cells C1, C2, C3, and C4 in the second direction Y.

At least one dummy line DM may be provided between the power line groups PG1 and PG2 and the bit line pairs BP1 and BP2 or may be provided between the power line groups PG1 and PG2 and the complementary bit line pairs BbP1 and BbP2.

At least one boundary dummy line BDM may be provided at a boundary between bit cells adjacent in the first direction X. At least one boundary dummy line BDM may be provided between bit lines connected to different bit cells. For example, at least one boundary dummy line BDM may be provided between the first complementary bit line BLAb of the first bit cell C1 and the first bit line BLA of the second bit cell B2.

According to an embodiment, the dummy line DM and the boundary dummy line BDM may be omitted or may be more provided than shown in FIG. 10.

Figure 11:
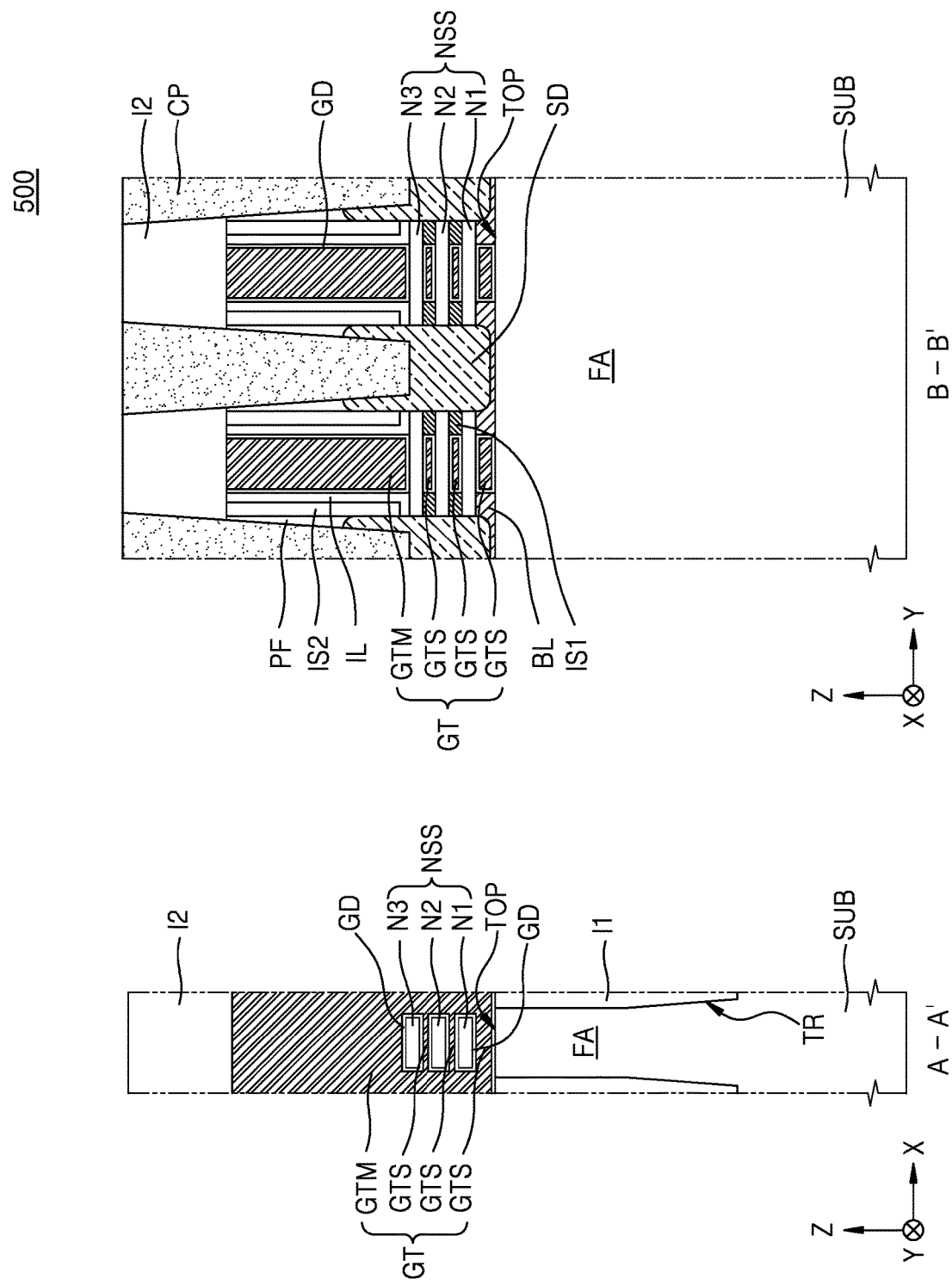
FIG. 11 is a cross-sectional view of a bit cell according to an example embodiment.

FIG. 11 is a cross-sectional view of a bit cell according to example embodiments. Specifically, an integrated circuit 500 of FIG. 11 may include a GAAFET, and the GAAFET may include an MBCFET. FIG. 11 is a view for explaining a GAAFET formed in the active pattern RX of FIG. 4, and in detail, a view for explaining an MBCFET. Accordingly, although nanosheets are illustrated in FIG. 11, the disclosure is not limited thereto, and an as such, according to another example embodiment integrated circuit may be implemented as nanowires. FIG. 11 is a cross-sectional view taken along lines A-A' and B-B' of FIG. 4, and contacts CA and CB and vias VA and VB of FIG. 4 are omitted.

Referring to FIG. 11, the integrated circuit 500 may include a fin-type active area FA protruding from the semiconductor substrate SUB and extending in the second direction Y. The semiconductor substrate SUB may include a conductive area, for example, a well doped with an impurity or a structure doped with an impurity. The fin-type active area FA may correspond to the active pattern RX of FIG. 4.

A trench TR defining a fin-type active area FA may be formed in the semiconductor substrate SUB. The trench TR may be filled with a shallow trench isolation (STI) film I1. The STI film I1 may include an insulating material.

The nanosheet stacked structure NSS may be spaced apart from the upper surface TOP of the fin-type active area FA. The nanosheet stacked structure NSS may face the upper surface TOP of the fin-type active area FA at a position spaced apart from the upper surface TOP of the fin-type active area FA. The nanosheet stacked structure NSS may correspond to the GAA patterns GAA of FIG. 4.

The nanosheet stacked structure NSS may include nanosheets N1, N2, and N3 extending parallel to the upper surface TOP of the fin-type active area FA. The nanosheets N1, N2, and N3 may be sequentially stacked on the upper surface TOP of the fin-type active area FA, and each may have a channel area. The nanosheets N1, N2, and N3 may be made of the same material as that of the semiconductor substrate SUB.

In this example embodiment, although it is shown that one nanosheet stacked structure NSS and a gate electrode GT are formed on one fin-type active area FA and three nanosheets N1, N2, and N3 are stacked on the nanosheet stacked structure NSS, the disclosure is not limited thereto. In addition, the planar shape of the nanosheet stacked structure NSS is shown in a rectangular shape, but is not limited thereto, and the nanosheet stacked structure NSS may have various planar shapes depending on the planar shape of the fin-type active area FA and the planar shape of the gate electrode GT.

The gate electrode GT may be formed on the fin-type active area FA. The gate electrode GT may extend in the first direction X. The gate electrode GT may cover the nanosheet stacked structure NSS. The gate electrode GT may be formed to surround at least a portion of the nanosheets N1, N2, and N3.

A source/drain area SD may be formed on the fin-type active area FA. The source/drain area SD may be connected to one end of the adjacent nanosheets N1, N2, and N3.

The gate electrode GT may include a main gate electrode GTM covering the upper surface of the nanosheet stacked structure NSS and sub-gate electrodes GTS formed between the fin-type active area FA and the nanosheets N1, N2, and N3. The main gate electrode GTM and the sub-gate electrodes GTS may be connected to each other. A thickness of the main gate electrode GTM may be greater than a thickness of each of the sub-gate electrodes GTS.

Both sidewalls of the sub-gate electrode provided closest to the fin-type active area FA among the sub-gate electrodes GTS may be covered with a buffer layer BL covering the upper surface TOP of the fin-type active area FA. The buffer layer BL may include a material different from that of the fin-type active area FA.

The gate dielectric film GD may be formed between the nanosheet stacked structure NSS and the gate electrode GT. The gate dielectric film GD may cover the surface of each of the plurality of nanosheets N1, N2, and N3. The gate dielectric film GD may include a high-k material.

The first insulating spacer IS1 may be formed to cover at least some of sidewalls of the sub-gate electrodes GTS. The first insulating spacer IS1 may be between the sub-gate electrodes GTS and the source/drain area SD. The first insulating spacer IS1 may be between the nanosheets N1, N2, and N3.

An insulating liner IL, a second insulating spacer IS2, and a protective film PF may be formed on the nanosheet stacked structure NSS. The insulating liner IL, the second insulating spacer IS2, and the protective film PF may cover a sidewall of the main gate electrode GTM. The insulating liner IL may be formed on the sidewall of the gate electrode GT and may partially cover the upper surface of the nanosheet N3 provided at the highest level among the nanosheets N1, N2, and N3. The second insulating spacer IS2 may be formed on the insulating liner IL, and the protective film PF may be formed on the second insulating spacer IS2. In some embodiments, the protective film PF may be omitted.

An interlayer insulating film 12 may be formed on the gate electrode GT. The interlayer insulating film 12 may include silicon oxide. A contact plug CP connected to the source/drain area SD through the interlayer insulating film 12 and the protective film PF may be formed on the source/drain area SD. The contact plug CP may be formed of a metal, a conductive metal nitride, or a combination thereof.

Figure 12:
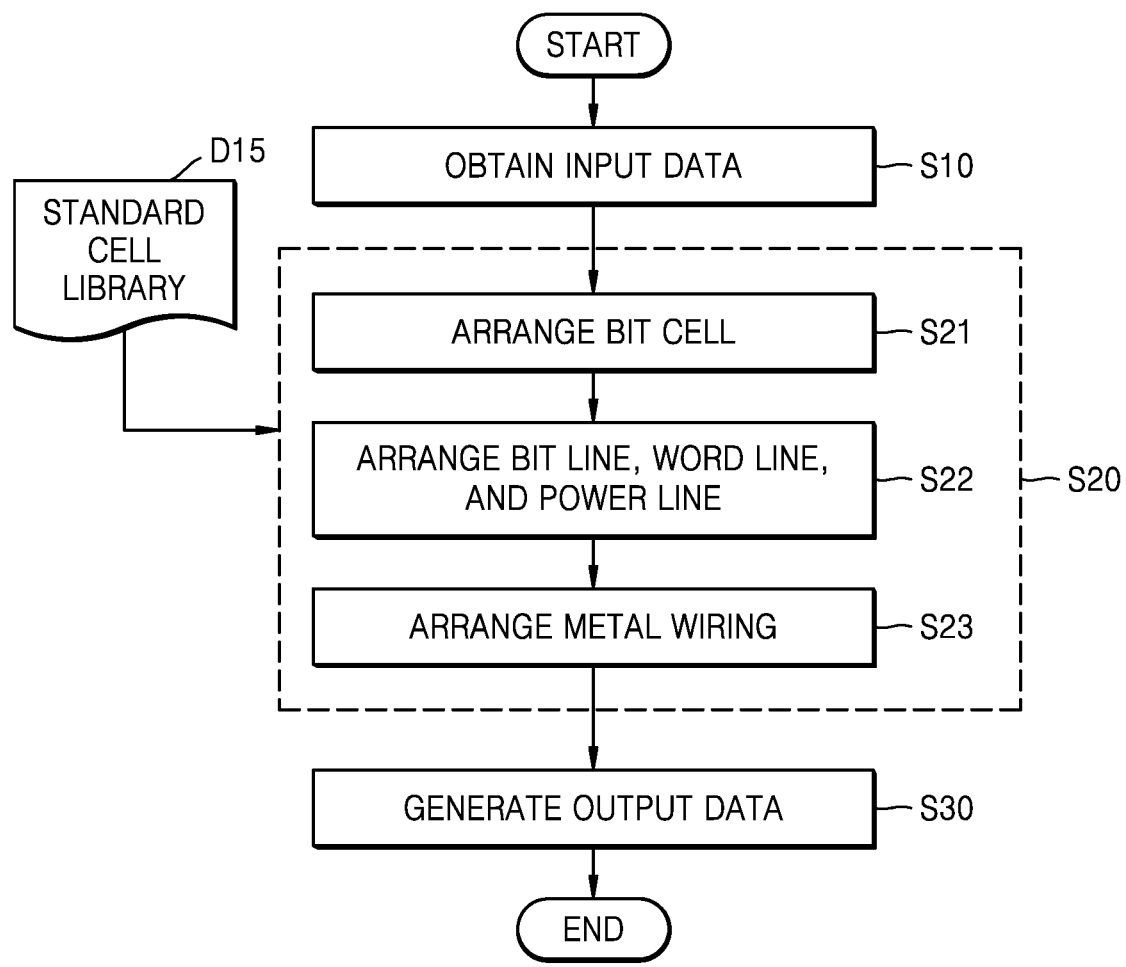
FIG. 12 is a flowchart illustrating a method of designing an IC according to an example embodiment.

FIG. 12 is a flowchart illustrating an example of a method of designing an integrated circuit according to an example embodiment. The integrated circuit may be one of the integrated circuits 100 to 500 described above with reference to FIGS. 1 to 11. Hereinafter, it will be described with reference to FIGS. 1 to 11.

Referring to FIG. 12, the design method of FIG. 12 may be performed by a computing system including at least one processor executing a series of instructions. As shown in FIG. 12, the method of designing an integrated circuit may include operations S10, S20 and S30.

In operation S10, input data may be obtained. The input data may be data defining an integrated circuit, and may include, for example, a netlist D13 of FIG. 14 and described later with reference to FIG. 14. The input data may include information on bit cells included in the integrated circuit and connections of the bit cells.

In operation S20, place and routing (P&R) may be performed. P&R may be performed based on a cell library D12 of FIG. 14 and described later with reference to FIG. 14. Operation S20 may include a plurality of operations S21, S22, and S23.

In operation S21, bit cells may be arranged at predetermined positions. The bit cells may be DPSRAM cells.

In operation S22, bit lines, word lines and power lines may be arranged on the bit cells. Bit lines, word lines, and power lines may be arranged on the first wiring layer. The word lines may shield the bit lines by being provided between the bit lines. A dummy line and a boundary dummy line may be further arranged on the bit cells. The dummy line may be provided between the bit line and the power line, and the boundary dummy line may be provided between bit lines included in different bit cells.

In operation S23, a metal wiring may be arranged on the bit lines, word lines and power lines. Metal wiring may be provided on the second wiring layer. Metal wiring may be electrically connected to word lines through vias.

In operation S30, output data may be generated. Output data may refer to data defining a layout of an integrated circuit. For example, it may include layout data D14 of FIG. 14 described later with reference to FIG. 14.

Figure 13:
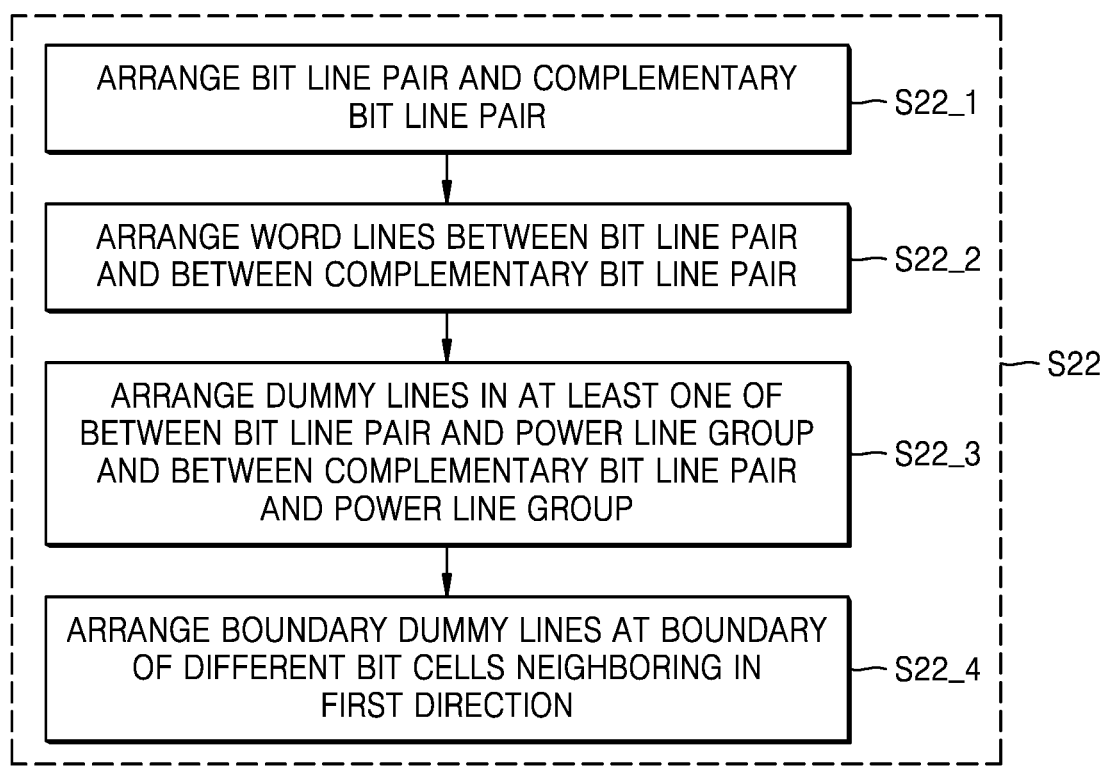
FIG. 13 is a flowchart illustrating a method of designing an IC according to example embodiments.

FIG. 13 is a flowchart illustrating an example of a method of designing an integrated circuit according to example embodiments. In detail, FIG. 13 is a flowchart explaining operation S22 of FIG. 12. Hereinafter, it will be described with reference to FIGS. 10 and 12.

As shown in FIG. 13, the operation of arranging the bit lines, word lines and power lines of operation S22 may include operations S22_1, S22_2, S22_3, and S22_4. According to an example embodiment, operations S22_1, S22_2, S22_3, and S22_4 may be performed in parallel.

In operation S22_1, a bit line pair BP and a complementary bit line pair BbP may be arranged on the bit cell. The bit line pair BP and the complementary bit line pair BbP may be arranged to be spaced apart from each other in the first direction. A power line group PG including a plurality of power lines PL may be provided between the bit line pair BP and the complementary bit line pair BbP.

In operation S22_2, word lines WLA and WLB may be arranged on the bit cell. The word lines WLA and WLB may be provided between the bit line pair BP and between the complementary bit line pairs BbP.

In operation S22_3, at least one dummy line DM may be arranged on the bit cell. The at least one dummy line DM may be provided between the bit line pair BP and the power line group PG or may be provided between the complementary bit line pair BbP and the power line group PG. In some embodiments, operation S11_3 may be omitted.

In operation S22_4, a boundary dummy line BDM may be arranged on the bit cell. The boundary dummy line BDM may be provided at a boundary between different bit cells adjacent to each other in the first direction X. The boundary dummy line BDM may be provided between bit lines connected to different bit cells. In some embodiments, operation S11_4 may be omitted.

After operation S22_4, operation S30 of FIG. 12 may be performed.

Figure 14:
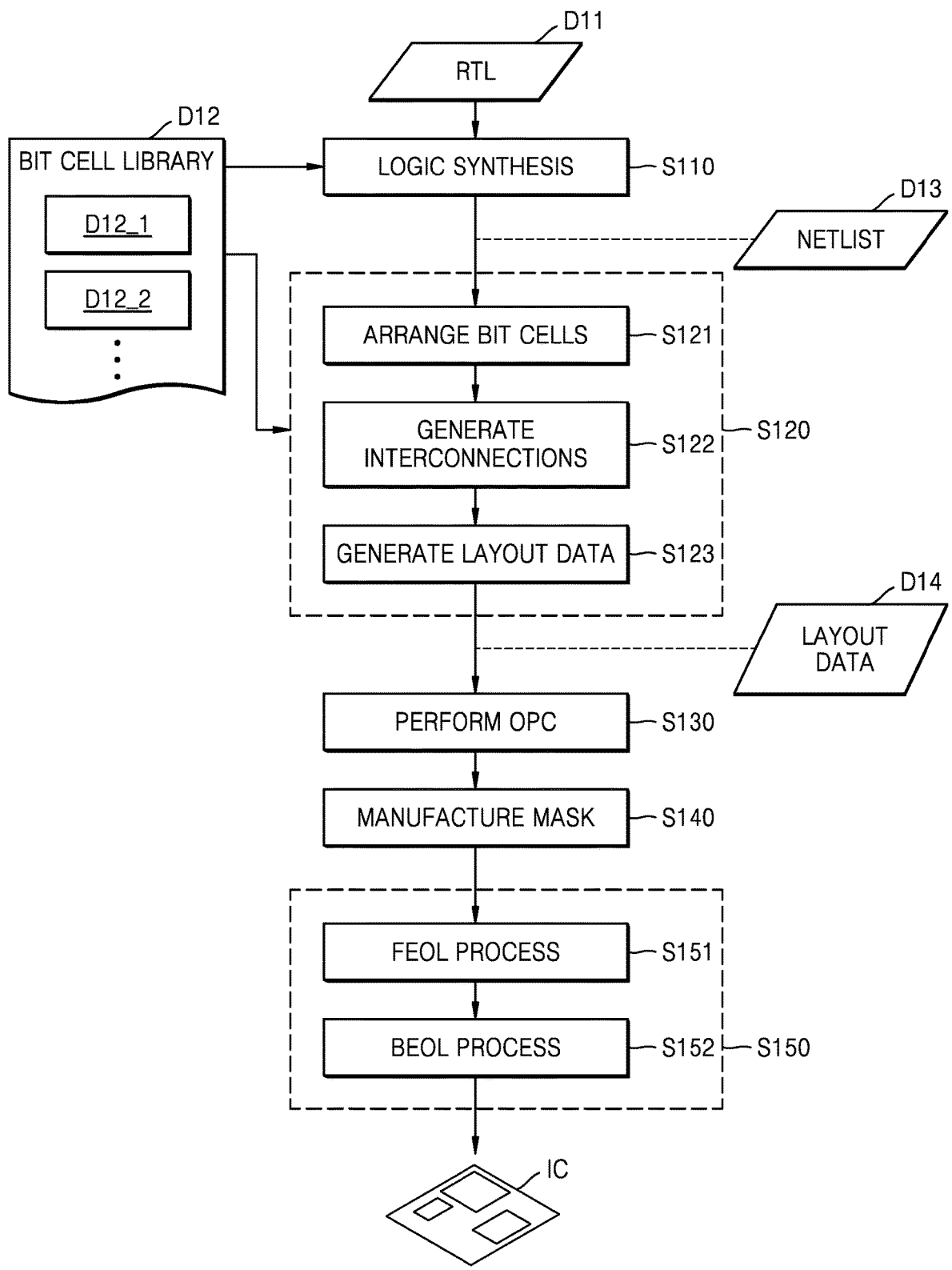
FIG. 14 is a flowchart illustrating a method of manufacturing an IC according to example embodiments.

FIG. 14 is a flowchart illustrating an example of a method of manufacturing an integrated circuit according to example embodiments. The integrated circuit may be one of the integrated circuits 100 to 500 described above with reference to FIGS. 1 to 11. Hereinafter, it will be described with reference to FIGS. 1 to 11.

Referring to FIG. 14, the bit cell library D12 may include information on the bit cell 12 included in the memory cell block 11 of FIG. 1. For example, the bit cell library D12 may include layout information of the bit cell 12 and the like. The bit cell library D12 may include data D12_1, D12-2, and the like defining the layout of the bit cell 12. For example, the bit cell library D12 may include data defining the layout of the integrated circuits 100 to 400 described above with reference to FIGS. 2 to 10.

In operation S110, a logic synthesis operation for generating the netlist data D13 from the RTL data D11 may be performed. For example, the semiconductor design tool refers to the cell library D12 and performs logical synthesis from the RTL data D11 written in Hardware Description Language (HDL) to generate netlist data D13 including a bitstream or a netlist. The HDL may include VHSIC Hardware Description Language (VHDL) and Verilog. In the logical synthesis process, information of the cell library D12 may be referred to.

In operation S120, a P&R operation for generating the layout data D14 from the netlist data D13 may be performed. Operation S120 may include a plurality of operations S121, S122, and S123. Operations S121 and S122 may correspond to operation S20 of FIG. 12.

In operation S121, an operation of arranging bit cells may be performed. For example, a semiconductor design tool (e.g., a P&R tool) may place a plurality of bit cells with reference to the cell library D12 from the netlist data D13.

In operation S122, an operation of generating interconnections may be performed. The interconnection may include first wiring including bit lines, complementary bit lines, power lines, word lines, dummy lines, and boundary dummy lines, and may include a second wiring including metal wirings electrically connected to the word lines. According to an embodiment, the dummy lines and the boundary dummy lines may be omitted.

The interconnection may be formed such that word lines are provided between bit lines and between complementary bit lines. Also, a dummy line may be provided between the bit line and the power line, or a boundary dummy line may be provided between the bit lines at a boundary between adjacent bit cells. Through the interconnection operation, an electrical signal may be transmitted to the bit cell. At least one contact and at least one via may be formed for interconnection.

In operation S123, an operation of generating the layout data D14 may be performed. The layout data D14 may include geometric information of bit cells and interconnections. The layout data D14 may have a format such as GDSII. The layout data D14 may correspond to the output data of FIG. 12.

In operation S130, the pattern on the mask may be determined by performing optical proximity correction (OPC) on the layout data D74. That is, a pattern having a desired shape may be formed by correcting a distortion phenomenon such as refraction caused by the characteristics of light in the layout data D14. In some embodiments, the layout of the integrated circuit may be limitedly modified in operation S130. Through this, the structure of the integrated circuit may be optimized. Operation S130 may be referred to as design polishing.

In operation S140, an operation of manufacturing a mask may be performed. In order to form the patterns determined in operation S130, at least one mask may be manufactured. The mask may include a photo mask.

In operation S150, an operation of fabricating an integrated circuit may be performed. For example, an integrated circuit may be fabricated by patterning a plurality of layers using the at least one mask fabricated in operation S140. Operation S150 may include a plurality of operations S151 and S152.

In operation S151, a front-end-of-line (FEOL) process may be performed. The FEOL may refer to forming individual elements on a substrate. The individual elements may include transistors, capacitors, resistors, and the like. The FEOL process includes an operation of planarization of a wafer, an operation of cleaning the wafer, an operation of forming a trench, an operation of forming a well, an operation of forming a gate line, and an operation of forming a source and drain. For example, step S151 may correspond to at least a portion of operations S21 and S22 of FIG. 12.

In step S152, a back-end-of-line (BEOL) process may be performed. The BEOL may refer to a process of interconnecting individual elements. For example, the BEOL may include an operation of silicidation of the gate, source and drain areas, an operation of adding a dielectric, a planarization operation, an operation of forming a hole, an operation of adding a metal layer, an operation of forming a via, an operation of forming a passivation layer, and the like. For example, operation S152 may correspond to at least a part of operation S22 and operation S23 of FIG. 12.

After operation S152, the packaged integrated circuit IC may be used as a component in various applications.

Figure 15:
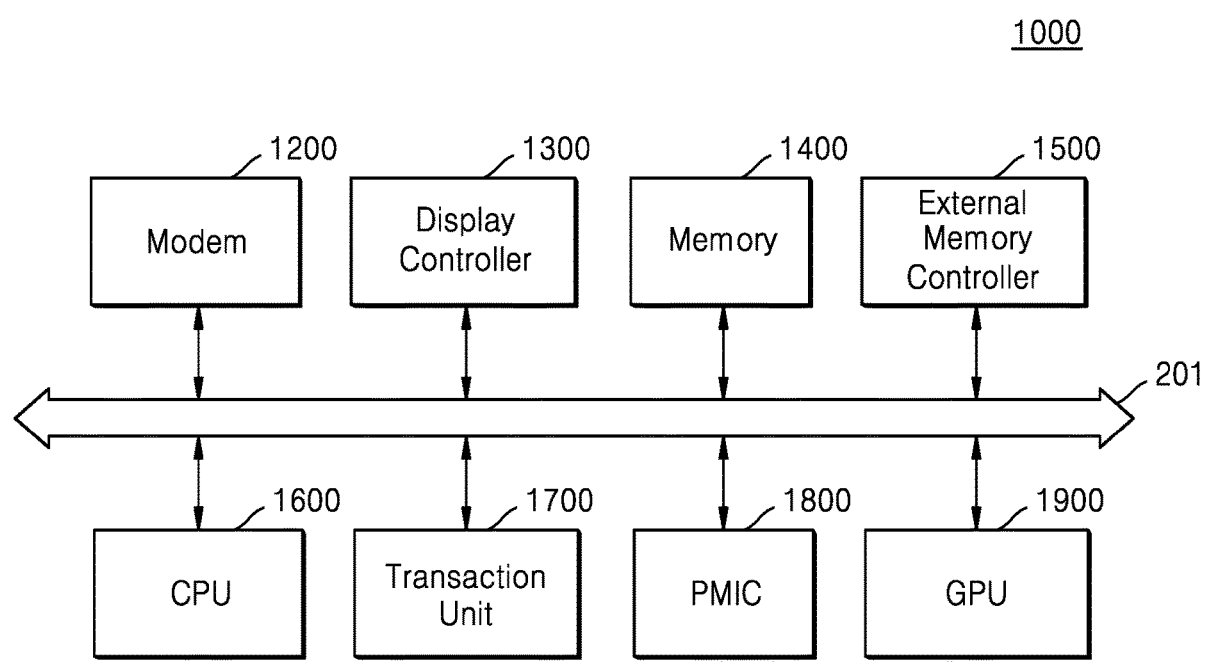
FIG. 15 is a block diagram illustrating a system on chip (SoC) including an IC according to an example embodiment.

FIG. 15 is a block diagram illustrating a system on chip (SoC) according to an example embodiment.

An SoC 1000 is an integrated circuit and may include an integrated circuit according to an example embodiment. The SoC 1000 implements complex functional blocks such as intellectual property (IP) that performs various functions in one chip, and active areas, standard cells, and bit cells arranged according to example embodiments may be included in respective functional blocks of the SoC 1000.

Referring to FIG. 15, the SoC 1000 may include a modem 1200, a display controller 1300, a memory 1400, an external memory controller 1500, a central processing unit (CPU) 1600, a transaction circuit 1700, a power management integrated circuit (PMIC) 1800, and a graphics processing unit (GPU) 1900, and each functional block of the SoC 1000 may communicate with each other through a system bus 1100.

The CPU 1600 that may control the overall operation of the SoC 1000 may control the operations of the other functional blocks, that is, the modem 1200, the display controller 1300, the memory 1400, the external memory controller 1500, the transaction circuit 1700, the PMIC 1800, and the GPU 1900. The modem 1200 may demodulate a signal received from the outside of the SoC 1000, or may modulate a signal generated inside the SoC 1000 and transmit the modulated signal to the outside. The external memory controller 1500 may control an operation of transmitting and receiving data to and from an external integrated circuit connected to the SoC 1000. For example, the program and/or data stored in the external integrated circuit may be provided to the CPU 1600 or the GPU 1900 under the control of the external memory controller 1500. The GPU 1900 may execute program instructions related to graphic processing. The GPU 1900 may receive graphic data through the external memory controller 1500, and may transmit graphic data processed by the GPU 1900 to the outside of the SoC 1000 through the external memory controller 1500. The transaction circuit 1700 may monitor data transactions of each functional block, and the PMIC 1800 may control power supplied to each functional block according to the control of the transaction circuit 1700. The display controller 1300 may transmit data generated inside the SoC 1000 to the display by controlling the display (or display device) outside the SoC 1000.

The memory 1400 may include non-volatile memory such as Electrically Erasable Programmable Read-Only Memory (EEPROM), flash memory, Phase Change Random Access Memory (PRAM), Resistance Random Access Memory (RRAM), Nano Floating Gate Memory (NFGM), Polymer Random Access Memory (PoRAM), Magnetic Random Access Memory (MRAM), Ferroelectric Random Access Memory (FRAM), and the like, and may include volatile memory such as Dynamic Random Access Memory (DRAM), Static Random Access Memory (SRAM), mobile DRAM, Double Data Rate Synchronous Dynamic Random Access Memory (DDR SDRAM), Low Power DDR (LPDDR) SDRAM, Graphic DDR (GDDR) SDRAM, Rambus Dynamic Random Access Memory (RDRAM), and the like.

Figure 16:
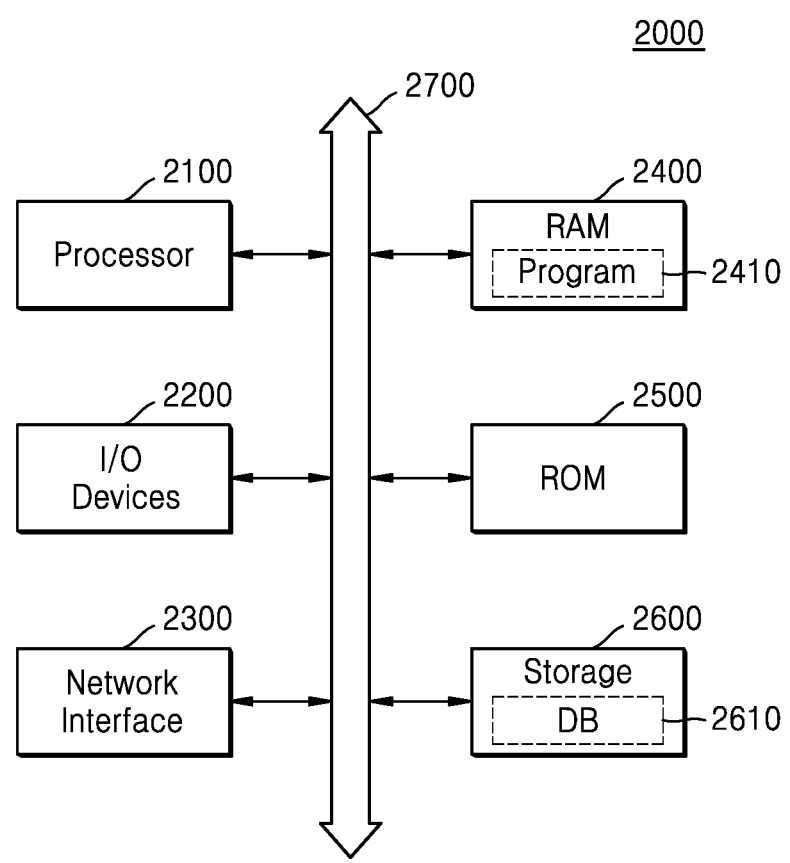
FIG. 16 is a block diagram illustrating a computing system including a memory storing a program according to an example embodiment.

FIG. 16 is a block diagram illustrating a computing system including a memory storing a program according to an example embodiment. According to example embodiments, at least some of the operations included in a method for manufacturing an integrated circuit (e.g., the method of FIG. 14) and the operations included in the method of designing an integrated circuit (e.g., the method of FIGS. 12 and 13) may be performed by the computing system 2000.

Referring to FIG. 16, the computing system 2000 may be a fixed computing system such as a desktop computer, a workstation, a server, and the like and may be a portable computing system such as a laptop computer.

The computing system 2000 may include a processor 2100, input/output (I/O) devices 2200, a network interface 2300, a random access memory (RAM) 2400, a read only memory (ROM) 2500, and a storage 2600. The processor 2100, the I/O devices 2200, the network interface 2300, the RAM 2400, the ROM 2500, and the storage 2600 may be connected to the bus 2700, and may communicate with each other through the bus 2700.

The processor 2100 may be referred to as a processing unit, and for example, may include at least one core capable of executing an arbitrary instruction set (e.g., Intel Architecture-32 (IA-32), 64-bit extension IA-32, x86-64, PowerPC, Sparc, MIPS, ARM, IA-64, and the like), such as a micro-processor, an application processor (AP), a digital signal processor (DSP), and a graphic processing unit (GPU). For example, the processor 2100 may access memory, that is, the RAM 2400 or the ROM 2500 through the bus 2700, and may execute instructions stored in the RAM 2400 or the ROM 2500.

The RAM 2400 may store a program 2410 or at least a part thereof for manufacturing an integrated circuit according to an example embodiment, and the program 2410 may cause the processor 2100 to perform at least some of operations included in a method for manufacturing an integrated circuit and operations included in a method of designing an integrated circuit. That is, the program 2410 may include a plurality of instructions executable by the processor 2100, and the plurality of instructions included in the program 2410 may cause the processor 2100 to perform, for example, at least some of the operations included in the flowchart described above with reference to FIGS. 12 to 14.

The storage 2600 may not lose stored data even if the power supplied to the computing system 2000 is cut off. For example, the storage 2600 may include a non-volatile integrated circuit, and may include a storage medium such as a magnetic tape, an optical disk, or a magnetic disk. Also, the storage 2600 may be removable from the computing system 2000. The storage 2600 may store the program 2410 according to an example embodiment, and before the program 2410 is executed by the processor 2100, the program 2410 or at least a portion thereof may be loaded into the RAM 2400 from the storage 2600. Alternatively, the storage 2600 may store a file written in a program language, and the program 2410 generated by a compiler or the like from a file or at least a part thereof may be loaded into the RAM 2400. In addition, the storage 2600 may store the database 2610, and the database 2610 may include information necessary for designing an integrated circuit, for example, the bit cell library D12 of FIG. 14.

The storage 2600 may store data to be processed by the processor 2100 or data processed by the processor 2100. That is, the processor 2100 may generate data by processing data stored in the storage 2600 according to the program 2410 and may store the generated data in the storage 2600. For example, the storage 2600 may store the RTL data D11, the netlist data D13, and/or the layout data D14 of FIG. 14.

The I/O devices 2200 may include an input device such as a keyboard and a pointing device, and may include an output device such as a display device and a printer. For example, through the I/O devices 2200, a user may trigger the execution of the program 2410 by the processor 2100, input the RTL data D11 and/or the netlist data D13 of FIG. 14, and check the layout data D14 of FIG. 14.

The network interface 2300 may provide access to a network external to the computing system 2000. For example, a network may include multiple computing systems and communication links, and the communication links may include wired links, optical links, wireless links, or any other type of links.

While example embodiments has been particularly shown and described, it will be understood that various changes in form and details may be made therein without departing from the spirit and scope of the following claims.

What is claimed is:

1. An integrated circuit comprising:
   a dual port Static Random Access Memory (SRAM) cell including a plurality of transistors;
   a bit line pair connected to the dual port SRAM cell, the bit line pair including a first bit line and a second bit line spaced apart from each other in a first direction and extending in a second direction perpendicular to the first direction;
   a power line group including a plurality of power lines spaced apart from each other in the first direction, spaced apart from the bit line pair placed in the first direction, and extending in the second direction, the power line group being configured to apply a voltage to the dual-port SRAM cell; and
   a first word line provided between the first bit line and the second bit line and connected to the dual port SRAM cell.

2. The integrated circuit of claim 1, further comprising:
   a complementary bit line pair including a first complementary bit line complementary to the first bit line and a second complementary bit line complementary to the second bit line, the complementary bit line pair being spaced apart from the bit line pair in the first direction, and connected to the dual port SRAM cell; and
   a second word line provided between the first complementary bit line and the second complementary bit line and connected to the dual port SRAM cell,
   wherein the power line group is provided between the bit line pair and the complementary bit line pair.

3. The integrated circuit of claim 1, wherein each of the plurality of power lines is configured to apply a power supply voltage or a ground voltage to the dual port SRAM cell.

4. The integrated circuit of claim 1, further comprising a dummy line provided between the bit line pair and the power line group and electrically independent from the dual port SRAM cell.

5. The integrated circuit of claim 1, wherein the bit line pair, the power line group, and the first word line are formed on a same wiring layer.

6. The integrated circuit of claim 1, further comprising:
   a metal wiring extending in the first direction and traversing the bit line pair and the power line group on the bit line pair and the power line group; and
   a via connecting the first word line to the metal wiring.

7. The integrated circuit of claim 1, wherein the plurality of transistors comprise a gate-all-around field-effect transistor (GAAFET) or a FinFET.

8. An integrated circuit comprising:
   a first bit cell and a second bit cell adjacent to the first bit cell in a first direction;
   a boundary dummy line extending in a second direction perpendicular to the first direction at a boundary between the first bit cell and the second bit cell and electrically independent from the first bit cell and the second bit cell;

a first bit line pair connected to the first bit cell, the first bit line pair including a first bit line and a second bit line extending in the second direction and spaced apart from each other in the first direction;

a first complementary bit line pair spaced apart from the first bit line pair in the first direction and connected to the first bit cell, the first complementary bit line pair including a first complementary bit line complementary to the first bit line and a second complementary bit line complementary to the second bit line;

a power line group including a plurality of power lines provided between the first bit line pair and the first complementary bit line pair and spaced apart from the first bit line pair in the first direction, the power line group being configured to apply a voltage to the first bit cell;

a first word line provided between the first bit line and the second bit line and connected to the first bit cell; and a second word line provided between the first complementary bit line and the second complementary bit line and connected to the first bit cell.

9. The integrated circuit of claim 8, further comprising:
a second bit line pair connected to the second bit cell, the second bit line pair including a third bit line and a fourth bit line extending in the second direction and spaced apart from each other in the first direction; and
a third word line provided between the third bit line and the fourth bit line and connected to the second bit cell,
wherein the boundary dummy line is provided between the first complementary bit line pair and the second bit line pair.

10. The integrated circuit of claim 8, further comprising at least one dummy line provided in at least one of between the first bit line pair and the power line group and between the first complementary bit line pair and the power line group, and electrically independent from the first bit cell.

11. The integrated circuit of claim 10, wherein a power supply voltage or a ground voltage is applied to the at least one dummy line.

12. The integrated circuit of claim 8, wherein the boundary dummy line, the first bit line pair, the first complementary bit line pair, the power line group, the first word line, and the second word line are formed on a same wiring layer.

13. The integrated circuit of claim 8, further comprising:

a metal wiring extending in the first direction and traversing the first bit line pair and the first complementary bit line pair on the first bit line pair and the first complementary bit line pair; and a via connecting the first word line to the metal wiring.

14. The integrated circuit of claim 8, wherein the first bit cell and the second bit cell comprise dual port Static Random Access Memory (SRAM) cells.

15. An integrated circuit design method comprising:
forming a first bit cell;
forming, on the first bit cell, a first bit line pair including a first bit line and a second bit line spaced apart from each other in a first direction and extending in a second direction perpendicular to the first direction;
forming, on the first bit cell, a first complementary bit line pair including a first complementary bit line and a second complementary bit line spaced apart from each other in the first direction and extending in the second direction; and
forming, on the first bit cell, a first word line between the first bit line and the second bit line and a second word line between the first complementary bit line and the second complementary bit line.

16. The method of claim 15, further comprising forming a power line group including a plurality of power lines between the first bit line pair and the first complementary bit line pair.

17. The method of claim 16, further comprising forming at least one dummy line electrically independent from the first bit cell in at least one of between the first bit line pair and the power line group and between the first complementary bit line pair and the power line group.

18. The method of claim 17, wherein a power voltage or a ground voltage is applied to the at least one dummy line.

19. The method of claim 15, further comprising:
forming a second bit cell adjacent to the first bit cell in the first direction; and
forming a boundary dummy line extending in the second direction at a boundary between the first bit cell and the second bit cell,
wherein the boundary dummy line is electrically independent from the first bit cell and the second bit cell.

20. The method of claim 15, wherein the forming of the first bit line pair, the forming of the first complementary bit line pair, and the forming of the first word line and the second word line are performed in parallel with each other.

* * * * *